United States Patent
Tsai et al.

(10) Patent No.: US 11,189,610 B2
(45) Date of Patent: Nov. 30, 2021

(54) SUBSTRATE STRUCTURE AND MANUFACTURING PROCESS

(71) Applicant: Advanced Semiconductor Engineering, Inc., Kaohsiung (TW)

(72) Inventors: Li-Chuan Tsai, Kaohsiung (TW); Wu Chang Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 16/020,953

(22) Filed: Jun. 27, 2018

(65) Prior Publication Data

US 2020/0006315 A1  Jan. 2, 2020

(51) Int. Cl.

| | |
|---|---|
| H05K 1/02 | (2006.01) |
| H01L 23/02 | (2006.01) |
| H01L 27/02 | (2006.01) |
| H01L 21/67 | (2006.01) |
| H01L 23/544 | (2006.01) |
| H01L 21/78 | (2006.01) |
| H01L 21/56 | (2006.01) |
| H01L 21/66 | (2006.01) |

(52) U.S. Cl.
CPC ........ *H01L 27/0207* (2013.01); *H01L 21/561* (2013.01); *H01L 21/67276* (2013.01); *H01L 21/67282* (2013.01); *H01L 21/67288* (2013.01); *H01L 21/78* (2013.01); *H01L 22/22* (2013.01); *H01L 23/544* (2013.01); *H01L 2223/54433* (2013.01)

(58) Field of Classification Search
CPC ....... H01L 2924/00014; H01L 2924/00; H01L 2224/48091; H01L 2224/48227; H01L 2224/73265; H01L 2224/97; H01L 2924/181; H01L 2224/32225; H01L 2924/15311

See application file for complete search history.

(56) References Cited

U.S. PATENT DOCUMENTS 5,508,089 A * 4/1996 Schulz-Harder .... H01L 21/4807
257/E23.004
5,854,741 A * 12/1998 Shim ...................... H01L 23/13
361/813

(Continued)

FOREIGN PATENT DOCUMENTS

TW 556960 U 10/2003

*Primary Examiner* — Bradley Smith
*Assistant Examiner* — David J Goodwin
(74) *Attorney, Agent, or Firm* — Foley & Lardner LLP

(57) ABSTRACT

A substrate structure includes at least one detachable first substrate unit and a substrate body. The detachable first substrate unit includes a plurality of corners and a plurality of first engagement portions. Each of the first engagement portions is disposed at each of the corners of the detachable first substrate unit. The substrate body includes a plurality of second substrate units, at least one opening and a plurality of second engagement portions. The opening is substantially defined by a plurality of sidewalls of the second substrate units, and includes a plurality of corners. Each of the second engagement portions is disposed at each of the corners of the opening. The detachable first substrate unit is disposed in the opening, and the second engagement portions are engaged with the first engagement portions.

14 Claims, 21 Drawing Sheets

(56) References Cited

U.S. PATENT DOCUMENTS

| | | | | |
|---|---|---|---|---|
| 6,512,288 B1* | 1/2003 | Shin | ................... | H01L 21/4846 |
| | | | | 257/668 |
| 6,551,855 B1 | 4/2003 | Ding et al. | | |
| 7,445,944 B2* | 11/2008 | Tong | ...................... | H01L 22/20 |
| | | | | 257/E21.598 |
| 7,559,138 B2* | 7/2009 | Sin | ...................... | H05K 3/0097 |
| | | | | 29/829 |
| 8,664,749 B2* | 3/2014 | Wu | ........................ | H01L 25/50 |
| | | | | 257/648 |
| 2007/0087630 A1* | 4/2007 | Ku | ...................... | H05K 3/0097 |
| | | | | 439/607.01 |
| 2010/0101844 A1* | 4/2010 | Hasegawa | ............ | H05K 3/0097 |
| | | | | 174/259 |
| 2012/0025462 A1* | 2/2012 | Knowlton | ............... | G06T 11/60 |
| | | | | 273/157 R |
| 2012/0160555 A1* | 6/2012 | Thumser | .............. | H05K 3/0097 |
| | | | | 174/262 |
| 2013/0025914 A1* | 1/2013 | Naganuma | ............ | H05K 3/4694 |
| | | | | 174/251 |
| 2013/0081857 A1* | 4/2013 | Takahashi | ............ | H05K 3/0097 |
| | | | | 174/250 |
| 2014/0177177 A1* | 6/2014 | Huang | ................... | H05K 3/225 |
| | | | | 361/748 |
| 2014/0240350 A1* | 8/2014 | Chen | ...................... | G06F 3/011 |
| | | | | 345/633 |
| 2018/0240350 A1* | 8/2018 | White | ...................... | G09B 1/36 |

* cited by examiner

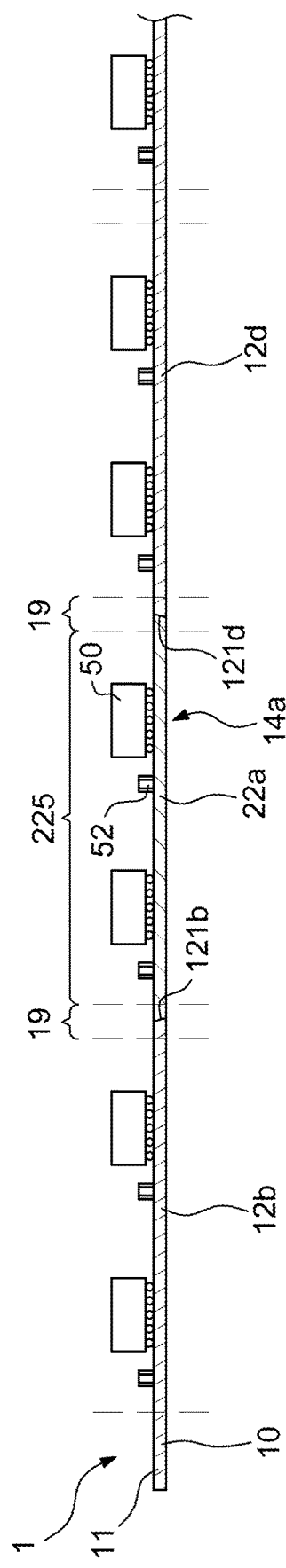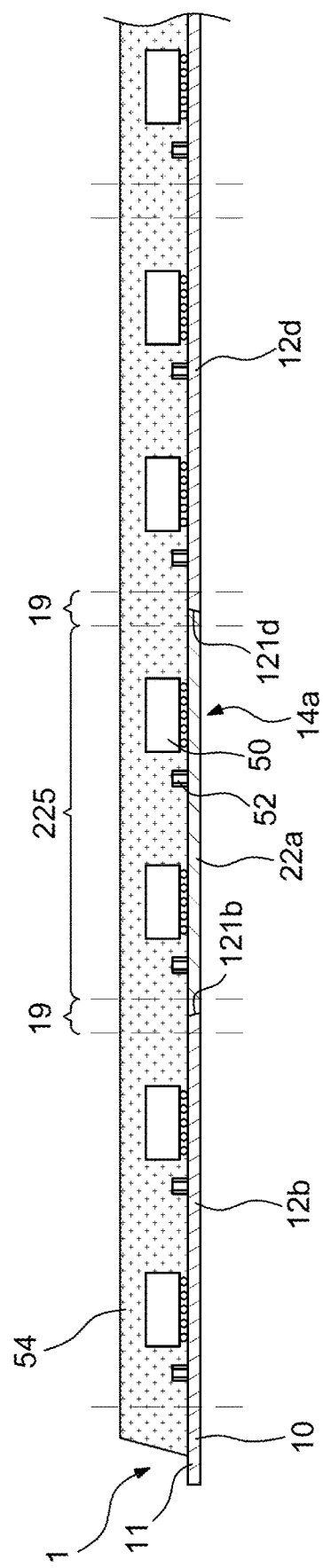

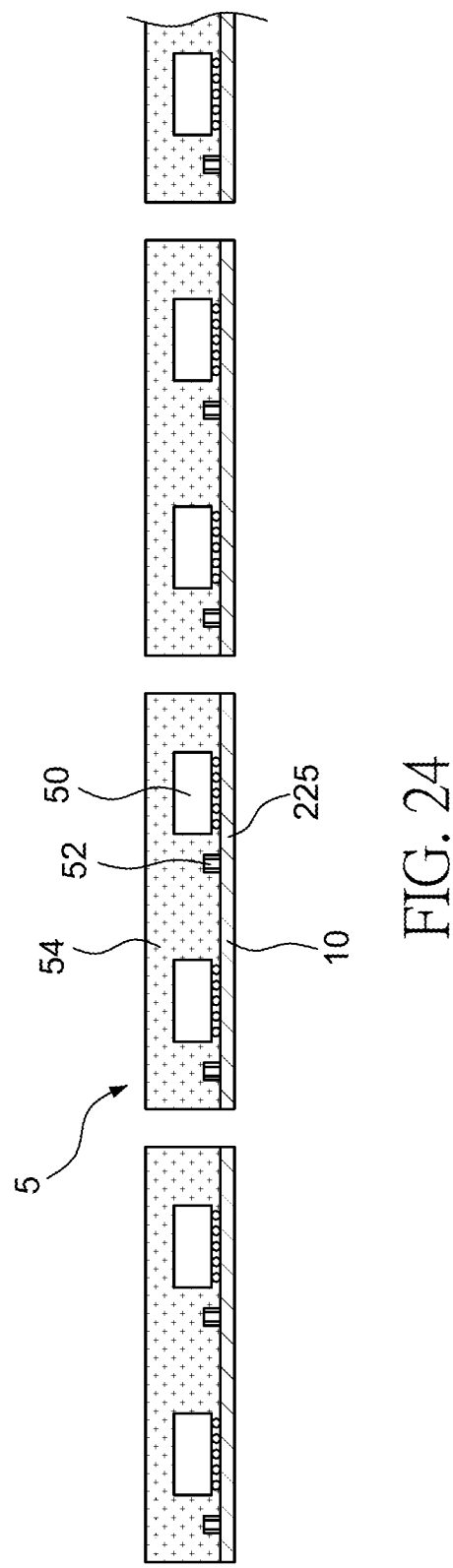

SUBSTRATE STRUCTURE AND MANUFACTURING PROCESS

BACKGROUND

1. Field of the Disclosure

The present disclosure relates to a substrate structure and a manufacturing process, and more particularly to a substrate structure including a detachable substrate unit, and a method for manufacturing the substrate structure and a package structure including the substrate structure.

2. Description of the Related Art

A semiconductor substrate structure may include a plurality of substrate units. After a testing process (e.g., an electrical testing and/or a functional testing), some of the substrate units may be found as defective units or bad units that fail to pass the testing, and are marked as unqualified units. That is, judgments of "NG" (no good) units are given to such units. The other substrate units may be found as non-defective units or good units that pass the testing, and are marked as qualified units. A ratio of the number of the unqualified units to the total number of all of the substrate units (including the qualified units and the unqualified units) is defined as a failure rate, a yield loss or a NG-unit acceptable quantity. To increase the units per hour ("UPH") and reduce the waste packaging material, the packaging plant usually stipulates that the substrate structure provided by the substrate supplier (substrate plant) should have a highest failure rate up to 10%, 20% or more (this is, the number of the unqualified units should be less than 10%, 20% or more of the total number of all of the substrate units). Therefore, before shipping the substrate structures to the packaging plant, the substrate supplier (substrate plant) should ensure that the failure rate of each of the substrate structures meets the desired specification that is proposed or raised by the packaging plant.

SUMMARY

In one aspect according to some embodiments, a substrate structure includes at least one detachable first substrate unit and a substrate body. The detachable first substrate unit includes a plurality of corners and a plurality of first engagement portions. Each of the first engagement portions is disposed at each of the corners of the detachable first substrate unit. The substrate body includes a plurality of second substrate units, at least one opening and a plurality of second engagement portions. The opening is substantially defined by a plurality of sidewalls of the second substrate units, and includes a plurality of corners. Each of the second engagement portions is disposed at each of the corners of the opening. The detachable first substrate unit is disposed in the opening, and the second engagement portions are engaged with the first engagement portions.

In another aspect according to some embodiments, a substrate structure includes at least one detachable first substrate unit and a substrate body. The detachable first substrate unit includes a plurality of sidewalls and a plurality of first engagement portions. The first engagement portion is disposed on the sidewall of the detachable first substrate unit. The substrate body includes a frame, a plurality of slot holes, a plurality of second substrate units, at least one opening and a plurality of second engagement portions. The slot holes are disposed on the frame to define the second substrate unit. The opening is substantially defined by at least one sidewall of the second substrate unit and at least two sidewalls of the frame. The second engagement portions are disposed on the sidewalls of the frame. The detachable first substrate unit is disposed in the opening, and each of the second engagement portions is engaged with each of the first engagement portions.

In another aspect according to some embodiments, a manufacturing process includes: (a) providing a first substrate structure, wherein the first substrate structure includes at least one first substrate unit defined by a plurality of imaginary cutting lines; (b) removing at least one first substrate unit from the first substrate structure, wherein the first substrate unit includes a plurality of corners and a plurality of first engagement portions, and each of the first engagement portions is disposed at each of the corners of the first substrate unit; (c) providing a second substrate structure, wherein the second substrate structure includes a plurality of second substrate units defined by a plurality of imaginary cutting lines; (d) removing at least one second substrate unit from the second substrate structure to form at least one opening and a plurality of second engagement portions, wherein the opening is substantially defined by a plurality of sidewalls of the second substrate units, the opening includes a plurality of corners, each of the second engagement portions is disposed at each of the corners of the opening; and (e) disposing the first substrate unit of (b) in the opening of the second substrate structure, wherein each of the second engagement portions is engaged with each of the first engagement portions.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 22 illustrates one or more stages of an example of a manufacturing process according to some embodiments of the present disclosure.

FIG. 23 illustrates one or more stages of an example of a manufacturing process according to some embodiments of the present disclosure.

FIG. 24 illustrates one or more stages of an example of a manufacturing process according to some embodiments of the present disclosure.

DETAILED DESCRIPTION

Figure 1:
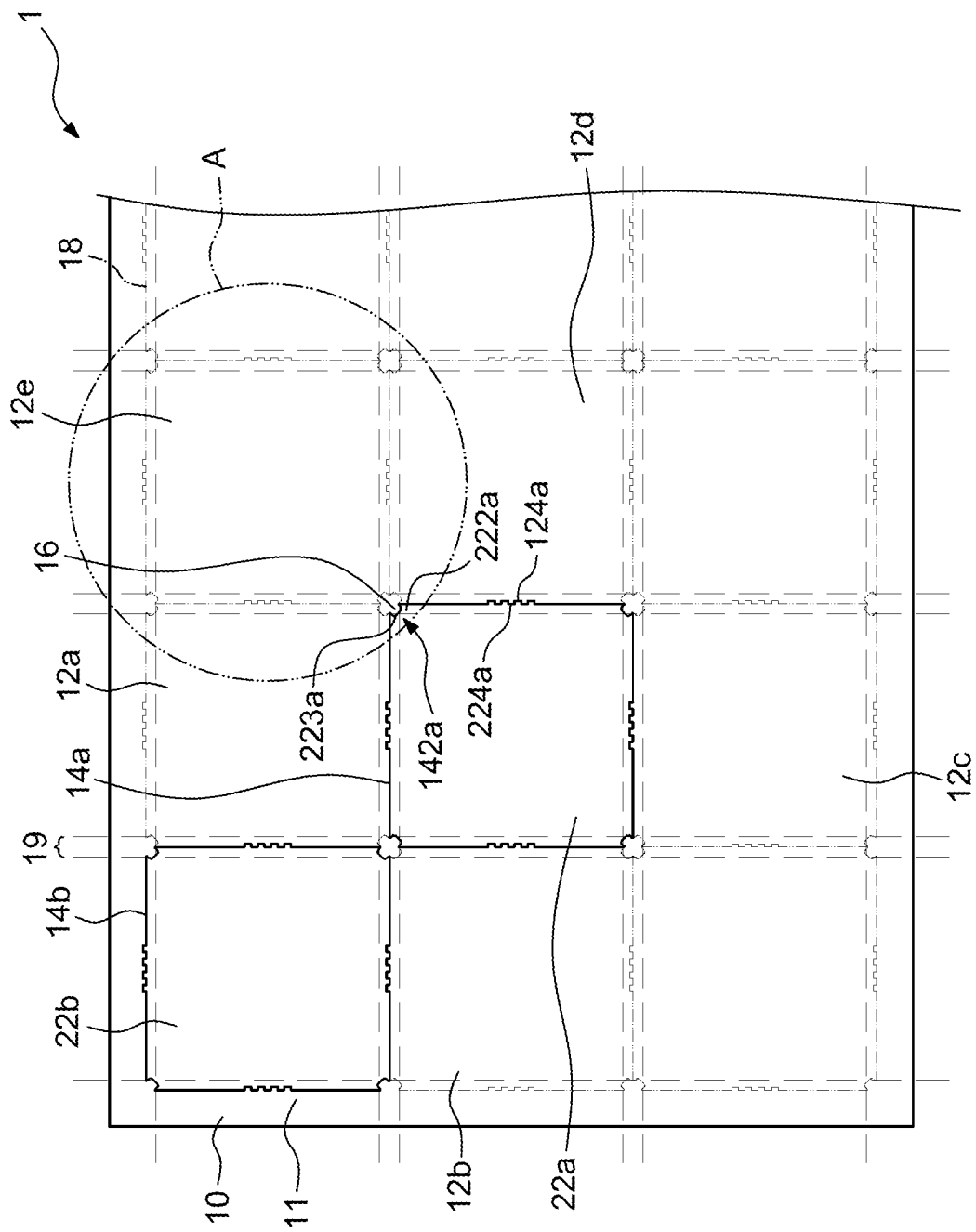
FIG. 1 illustrates a top view of a substrate structure according to one or more embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a substrate structure including at least one detachable first substrate unit. At least some embodiments of the present disclosure provide for techniques for manufacturing the substrate structure and a package structure including the substrate structure.

In a comparative embodiment, if the failure rate of a first substrate structure does not meet the desired specification that is proposed or raised by the packaging plant (that is, the number of the unqualified units exceeds the acceptable quantity), the substrate supplier (substrate plant) will conduct a compensation method to reduce the failure rate of the first substrate structure. The compensation method is described as follows. An unqualified unit (or a NG unit) is cut away from the first substrate structure to form an opening in the first substrate structure by, for example, punching. A qualified unit (or a known good unit) is cut from a compensation substrate structure to form a compensation qualified unit (or a compensation known good unit) by, for example, punching. The size and the profile of the compensation qualified unit are substantially the same as the size and the profile of the unqualified unit. Then, the unqualified unit is replaced by the compensation qualified unit. That is, the compensation qualified unit is disposed or placed in the opening of the first substrate structure. Thus, the failure rate of the first substrate structure is improved. However, the first substrate structure may not hold the compensation qualified unit tightly, thus, the engagement force between the compensation qualified unit and the first substrate structure may be loose, and the compensation qualified unit may fall off from the first substrate structure readily.

To address such concerns, in a comparative embodiment, the corners of the compensation qualified unit and the corners of the unqualified unit are designed to have a special profile. For example, the four corners of the unqualified unit are connected to the frame of the first substrate structure through connecting bars before cutting process. Then, during the cutting process, the connecting bars are cut by a specific cutting tool or a punching tool, so that the portion of the connecting bar remaining in the unqualified unit has a special profile such as a protrusion portion, and the portion of the connecting bar remaining in the frame of the first substrate structure has a special profile such as a recess portion. Similarly, the four corners of the compensation qualified unit are connected to the frame of the compensation substrate structure through connecting bars before cutting process. Then, during the cutting process, the connecting bars are cut by a specific cutting tool or a punching tool, so that the portion of the connecting bar remaining in the compensation qualified unit has a special profile such as a protrusion portion, and the portion of the connecting bar remaining in the frame of the compensation substrate structure has a special profile such as a recess portion. Then, the portion (e.g., a protrusion portion) of the connecting bar remaining in the compensation qualified unit may fit the portion (e.g., a recess portion) of the connecting bar remaining in the frame of the first substrate structure. Thus, the engagement force between the compensation qualified unit and the first substrate structure may be improved. However, the aforementioned solution may be adapted for the substrate structure used in a PBGA (Pin/Ball Grid Array) type.

The present disclosure provides for a substrate structure including at least one detachable substrate unit to address at least the above concerns, and improved techniques for manufacturing process. In some embodiments, the detachable substrate unit includes a plurality of first engagement portions that is capable of being engaged with a plurality of second engagement portions disposed in an opening of a substrate body. Thus, the substrate body may hold the detachable substrate unit tightly, and the solution can be adapted for any type of substrate structure.

Figure 2:
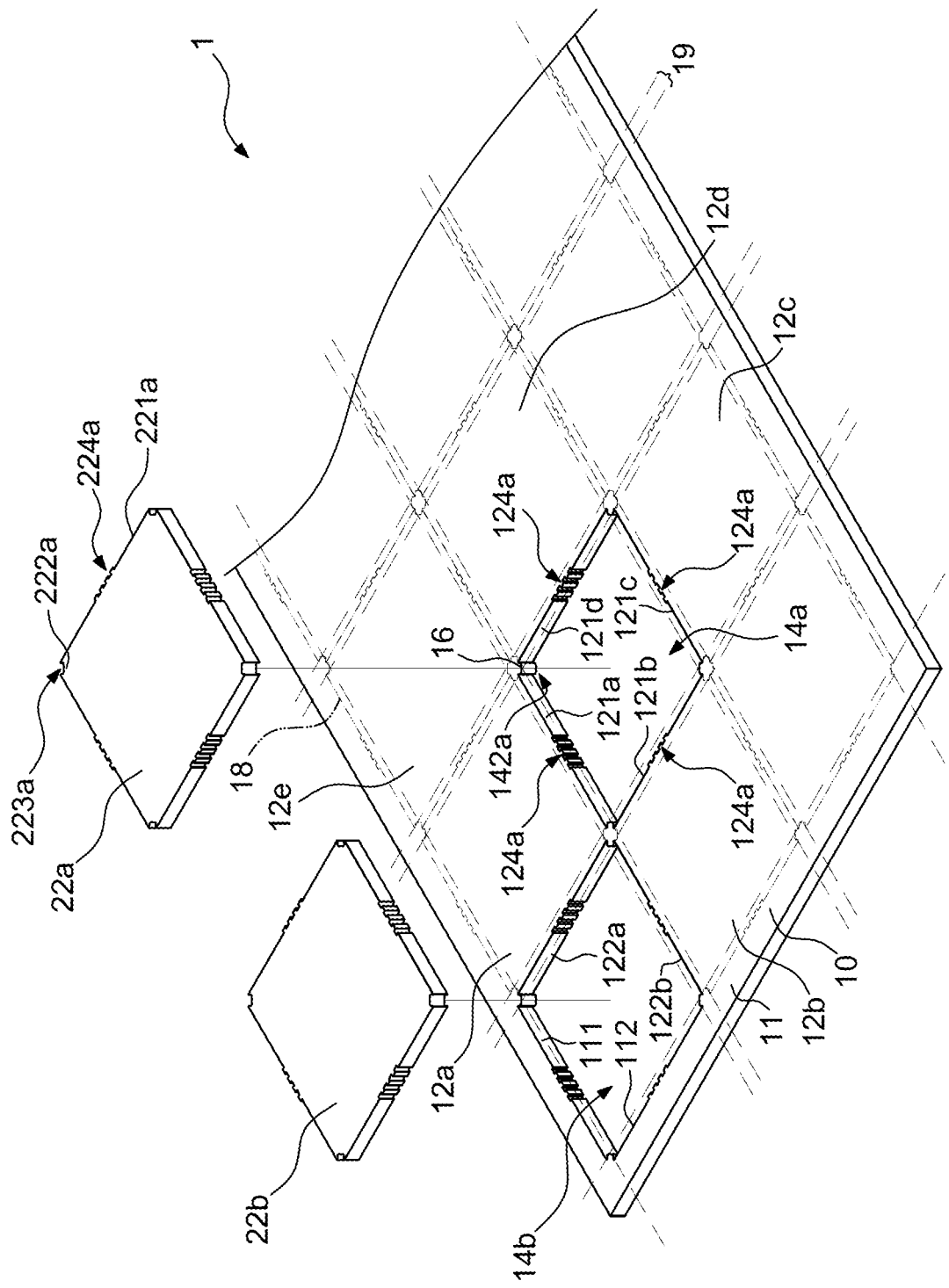
FIG. 2 illustrates a perspective explosive view of FIG. 1.

FIG. 1 illustrates a top view of a substrate structure 1 according to one or more embodiments of the present disclosure. FIG. 2 illustrates a perspective explosive view substrate of the structure 1 of FIG. 1. The substrate structure 1 may be a matrix array BGA substrate or a grid array BGA substrate. That is, the substrate units (for example, the substrate units 12a, 12b, 12c, 12d, 12e) of the substrate structure 1 are disposed or arranged side by side in an array. The entire periphery side surfaces of one substrate unit are connected to the entire periphery side surfaces of the adjacent substrate units, and there is no slot hole between two substrate units. In addition, there may be no boundary between the singulation street 19 and the substrate units. Thus, the substrate structure 1 may be a continuous plate structure, and an encapsulant will cover all the substrate units on one side of the substrate structure 1 during a molding process. For example, before the molding process, the substrate structure 1 may be disposed or accommodated in one cavity of a mold chase. The substrate structure 1 may have a single molding gate, thus, during the molding process, the encapsulant may flow through the molding gate to enter the cavity of a mold chase, and cover all the substrate units concurrently. The encapsulant is formed concurrently and integrally.

Figure 12:
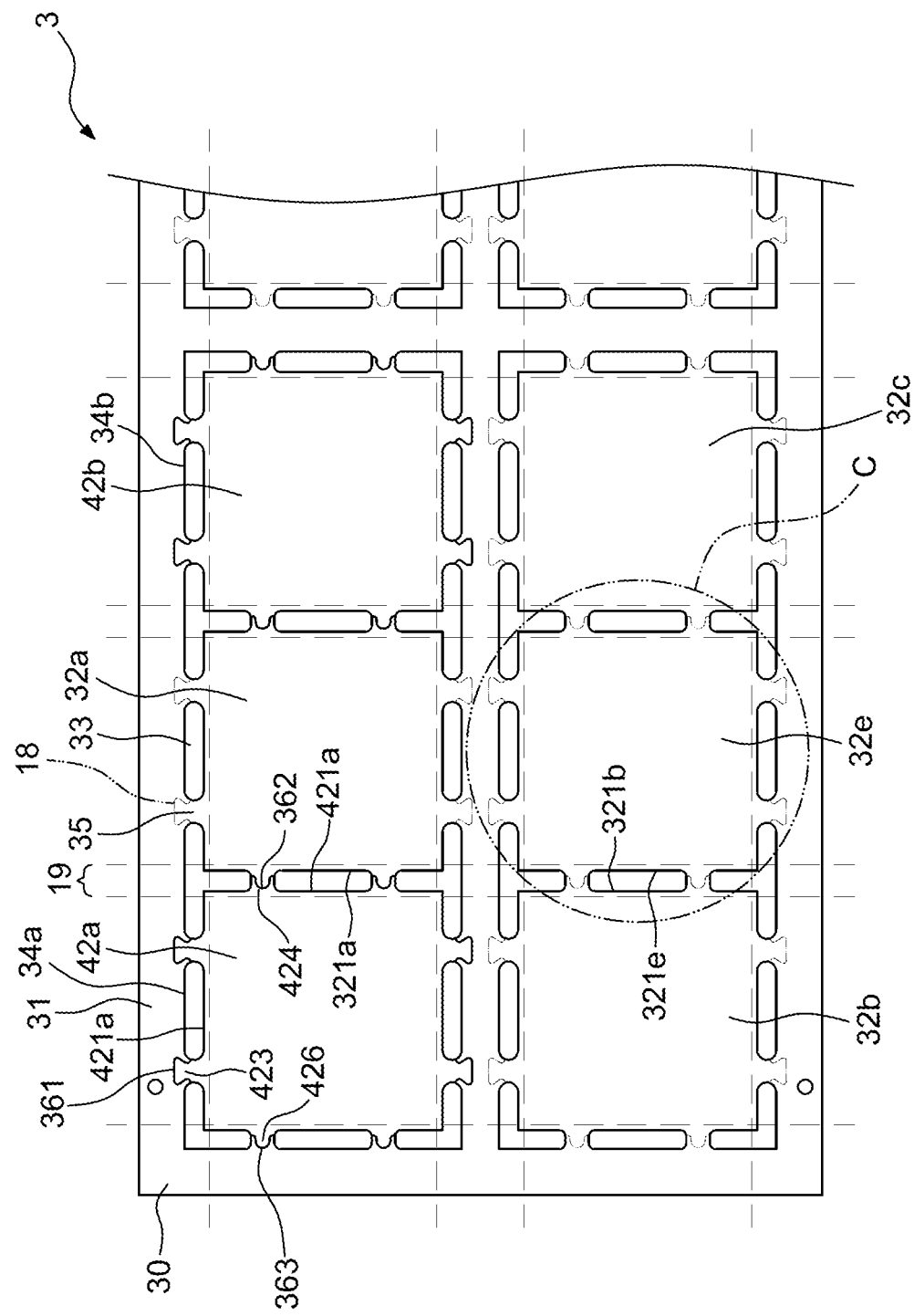
FIG. 12 illustrates a top view of a substrate structure according to one or more embodiments of the present disclosure.
Figure 13:
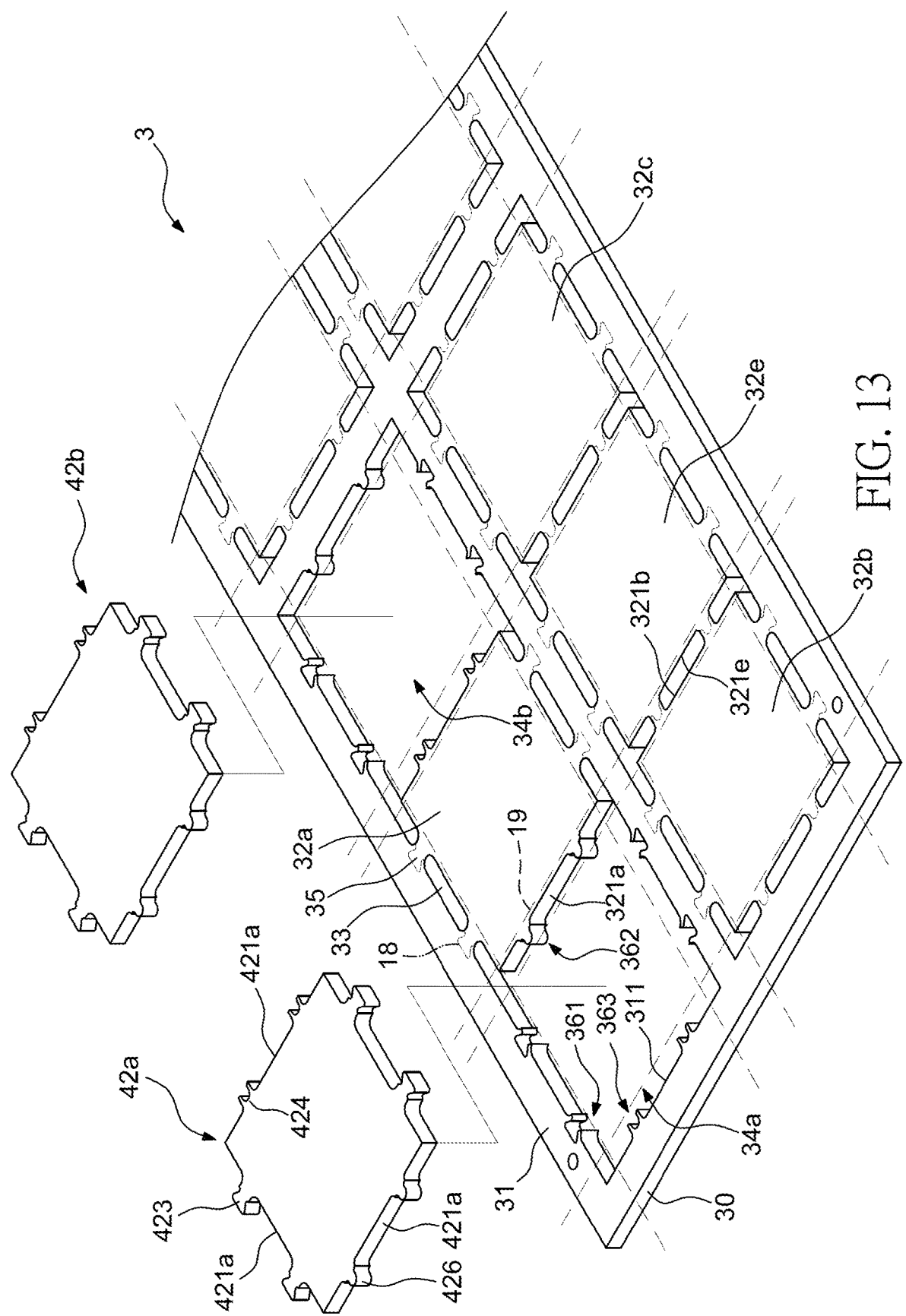
FIG. 13 illustrates a perspective explosive view of the substrate structure of FIG. 12.

It is understood that another type of substrate structure may be the aforementioned PBGA substrate 3 (FIGS. 12 and 13). The PBGA substrate includes a plurality of slot holes disposed between the substrate units. Thus, the substrate units are separated by the slot holes, and are connected to the frame of the PBGA substrate through connecting bars. There may be a gap between the side surface of one substrate unit and the side surface of the adjacent substrate unit. For example, before the molding process, the PBGA substrate may be disposed or accommodated in a plurality of cavities of a mold chase, and each of the substrate units is disposed in each of the cavities of the mold chase. Each of the substrate units may have a molding gate, thus, during the molding process, the molding material may flow through the molding gate to cover each of the substrate units in the cavity of the mold chase to form an encapsulant. Thus, there may be a plurality of encapsulants formed on the PBGA substrate, and each of the encapsulants is disposed on each of the substrate units.

Referring to FIG. 1 and FIG. 2, the substrate structure 1 includes at least one detachable first substrate unit (e.g., the first substrate units 22a, 22b) and a substrate body 10. The detachable first substrate units 22a, 22b are compensation qualified units (or compensation known good units) that are cut from a compensation substrate structure. For example, the detachable first substrate unit 22a includes a plurality of corners 222a (e.g., four corners 222a), a plurality of first engagement portions 223a (e.g., four first engagement portions 223a) and a plurality of first sawtooth portions 224a (e.g., four first sawtooth portions 224a). The detachable first substrate unit 22a has a plurality of sidewalls 221a (e.g., four sidewalls 221a). Each of the sidewalls 221a is disposed between two corners 222a. Each of the first sawtooth portions 224a is disposed on each of the sidewalls 221a. Each of the first engagement portions 223a is disposed at each of the corners 222a of the detachable first substrate unit 22a. It is noted that a size, a dimension and a profile of the detachable first substrate unit 22b may be substantially the same as a size, a dimension and a profile of the detachable first substrate unit 22a. The material of the detachable first substrate unit (e.g., the first substrate units 22a, 22b) may include a glass-reinforced epoxy resin material (e.g., FR4), bismaleimide triazine ("BT"), epoxy, silicon, print circuit board ("PCB") material, glass or ceramic.

The material of the substrate body 10 may be the same as or different from the material of the detachable first substrate unit (e.g., the first substrate units 22a, 22b). For example, the material of the substrate body 10 may include a glass-reinforced epoxy resin material (e.g., FR4), bismaleimide triazine ("BT"), epoxy, silicon, print circuit board ("PCB") material, glass or ceramic. As shown in FIG. 1 and FIG. 2, the substrate body 10 includes a frame 11, a plurality of second substrate units (e.g., the second substrate units 12a, 12b, 12c, 12d, 12e), at least one opening (e.g., the openings 14a, 14b), a plurality of second engagement portions 16, a plurality of second sawtooth portions 124a, a plurality of imaginary cutting lines 18 and a plurality of singulation streets 19. The frame 11 surrounds the second substrate units (e.g., the second substrate units 12a, 12b, 12c, 12d, 12e) and the detachable first substrate unit (e.g., the first substrate units 22a, 22b). The frame 11 may be also referred to as the "side rail".

The second substrate units (e.g., the second substrate units 12a, 12b, 12c, 12d, 12e) are defined by the imaginary cutting lines 18. It is noted that the imaginary cutting lines 18 are different from the singulation streets 19 in the present disclosure. If some of the second substrate units are found as defective units or bad units that fail to pass the testing (e.g., electrical testing and/or functional testing), they will be marked as unqualified units or "NG" units, and will be cut away along the imaginary cutting lines 18. Then, they will be replaced by qualified units (or known good units) that are cut from a compensation substrate structure. In comparison, after a molding process, the substrate structure 1 and an encapsulant that covers the electrical elements on the substrate structure 1 will be singulated along the singulation streets 19 to form a plurality of package structures. As shown in FIG. 1, there is no slot hole between the second substrate units (e.g., the second substrate units 12a, 12b, 12c, 12d, 12e), between the second substrate units (e.g., the second substrate units 12a, 12b, 12c, 12d, 12e) and the frame 11, between the detachable first substrate unit (e.g., the first substrate units 22a, 22b) and the frame 11, and between the second substrate units (e.g., the second substrate units 12a, 12b, 12c, 12d, 12e) and the detachable first substrate unit (e.g., the first substrate units 22a, 22b).

As shown in FIG. 2, the second substrate unit (e.g., the second substrate units 12a, 12b, 12c, 12d, 12e) may have a sidewall if its adjacent substrate unit is cut away. For example, the second substrate unit 12a has a lower sidewall 121a, the second substrate unit 12b has a right sidewall 121b, the second substrate unit 12c has an upper sidewall 121c, and the second substrate units 12d has a left sidewall 121d. The opening 14a is substantially defined by a plurality of the sidewalls (e.g., the sidewalls 121a, 121b, 121c, 121d) of the second substrate units (e.g., the second substrate units 12a, 12b, 12c, 12d). That is, the sidewalls (e.g., the sidewalls 121a, 121b, 121c, 121d) of the second substrate units (e.g., the second substrate units 12a, 12b, 12c, 12d) are the sidewalls of the opening 14a. The second sawtooth portions 124a are disposed on the sidewalls (e.g., the sidewalls 121a, 121b, 121c, 121d) of the second substrate units (e.g., the second substrate units 12a, 12b, 12c, 12d).

In addition, for example, the second substrate unit 12a has a right sidewall 122a, the second substrate unit 12b has an upper sidewall 122b, and the frame 11 has an inner upper sidewall 111 and an inner right sidewall 112. Similarly, the opening 14b is substantially defined by a plurality of the sidewalls (e.g., the sidewalls 122a, 122b) of the second substrate units (e.g., the second substrate units 12a, 12b) and the sidewalls (e.g., the sidewalls 111, 112) of the frame 11. That is, the sidewalls (e.g., the sidewalls 122a, 122b) of the second substrate units (e.g., the second substrate units 12a, 12b) and the sidewalls (e.g., the sidewalls 111, 112) of the frame 11 are the sidewalls of the opening 14b.

In one or more embodiments, a size, a dimension and a profile of the second substrate unit (e.g., the second substrate unit 12a, 12b, 12c, 12d) may be substantially equal to a size, a dimension and a profile of the opening (e.g., the opening 14a, 14b). Furthermore, a size, a dimension and a profile of the detachable first substrate unit (e.g., the first substrate units 22a, 22b) may be substantially equal to the size, the dimension and the profile of the opening (e.g., the opening 14a, 14b). In one or more embodiments, a width $W_1$ (FIG. 3) of the detachable first substrate unit (e.g., the first substrate unit 22a, 22b) may be substantially equal to or greater than a width $W_2$ (FIG. 6) of the opening (e.g., the opening 14a, 14b). In one or more embodiments, the width $W_1$ of the detachable first substrate unit (e.g., the first substrate unit 22a, 22b) is greater than the width $W_2$ of the opening (e.g., the opening 14a, 14b) by 10 μm or more, 20 μm or more, 30 μm or more. The opening 14a includes a plurality of corners 142a (e.g., four corners 142a). Each of the second engagement portions 16 is disposed at each of the corners 142a of the opening 14a.

As shown in FIG. 1, when the detachable first substrate unit (e.g., the first substrate unit 22a, 22b) is disposed in the opening (e.g., the opening 14a, 14b), the second engagement portions 16 are engaged with the first engagement portions 223a, and at least one sidewall of the detachable first substrate unit (e.g., the first substrate unit 22a, 22b) contacts the sidewall of the second substrate unit (e.g., the second substrate unit 12a, 12b, 12c, 12d). For example, the detachable first substrate unit 22a is disposed in the opening 14a, the second engagement portions 16 at the corners 142a of the opening 14a are engaged with the first engagement portions 223a at the corners 222a of the detachable first substrate unit 22a. In addition, the first sawtooth portions 224a on the sidewalls 221a of the detachable first substrate unit 22a are engaged with the second sawtooth portions 124a on the sidewalls (e.g., the sidewalls 121a, 121b, 121c, 121d) of the second substrate units (e.g., the second substrate units 12a, 12b, 12c, 12d). Therefore, the failure rate of the substrate structure 1 is improved. In addition, the substrate body 10 may hold the compensation qualified detachable first substrate unit (e.g., the first substrate unit 22a, 22b) tightly, that is, the detachable first substrate unit (e.g., the first substrate unit 22a, 22b) may be disposed in the opening (e.g., the opening 14a, 14b) securely. The engagement force between the detachable first substrate unit (e.g., the first substrate unit 22a, 22b) and the substrate body 10 may be relatively high, and the first substrate unit (e.g., the first substrate unit 22a, 22b) may not fall off from the substrate body 10 readily.

Figure 3:
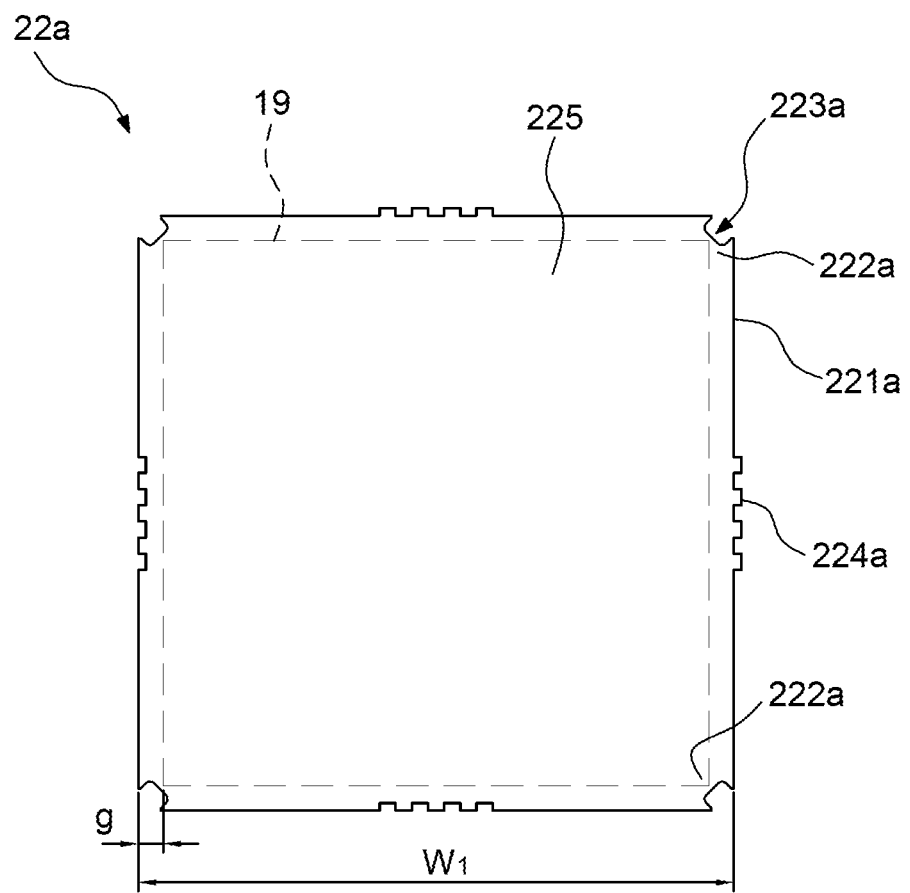
FIG. 3 illustrates a top view of a first substrate unit of FIG. 1 and FIG. 2.

FIG. 3 illustrates a top view of a first substrate unit 22a of FIG. 1 and FIG. 2. The first substrate unit 22a includes the four corners 222a, the four first engagement portions 223a, the four first sawtooth portions 224a and an effective area 225. The detachable first substrate unit 22a has the four sidewalls 221a. Each of the sidewalls 221a is disposed between two corners 222a. Each of the first engagement portions 223a is disposed at each of the corners 222a of the detachable first substrate unit 22a. The first engagement portion 223a is a recess portion or a notch. As shown in FIG. 3, the shape of the detachable first substrate unit 22a is a square that has a width $W_1$. However, in other embodiment, the shape of the detachable first substrate unit 22a may be other shape. As shown in FIG. 3, the shape of the first engagement portion 223a is a square or a trapezoid. However, in other embodiment, the shape of the first engagement portion 223a may be other shape such as a triangle or a semicircle. Furthermore, each of the first sawtooth portions 224a is disposed on each of the sidewalls 221a. As shown in FIG. 3, the shape of the tooth of the first sawtooth portion 224a is a square. However, in other embodiment, the shape of the tooth of the first sawtooth portion 224a may be other shape such as a triangle or a semicircle. In addition, the effective area 225 is defined by the singulation streets 19, and the first engagement portions 223a are disposed outside the effective area 225. It is noted that the electrical elements (e.g., semiconductor die, passive device or circuit layer) are disposed within the effective area 225. After a molding process, the first substrate unit 22a and an encapsulant that covers the electrical elements (e.g., semiconductor die, passive device or circuit layer) on the first substrate unit 22a will be singulated along the singulation streets 19 to form a package structure. Therefore, the effective area 225 is the area that remains in the package structure. As shown in FIG. 3, there is a gap g between the sidewall 221a of the detachable first substrate unit 22a and the effective area 225 of the detachable first substrate unit 22a. The gap g is greater than zero. For example, the gap g may be greater than 0.1 mm, greater than 0.5 mm, or greater than 1.0 mm.

Figure 4:
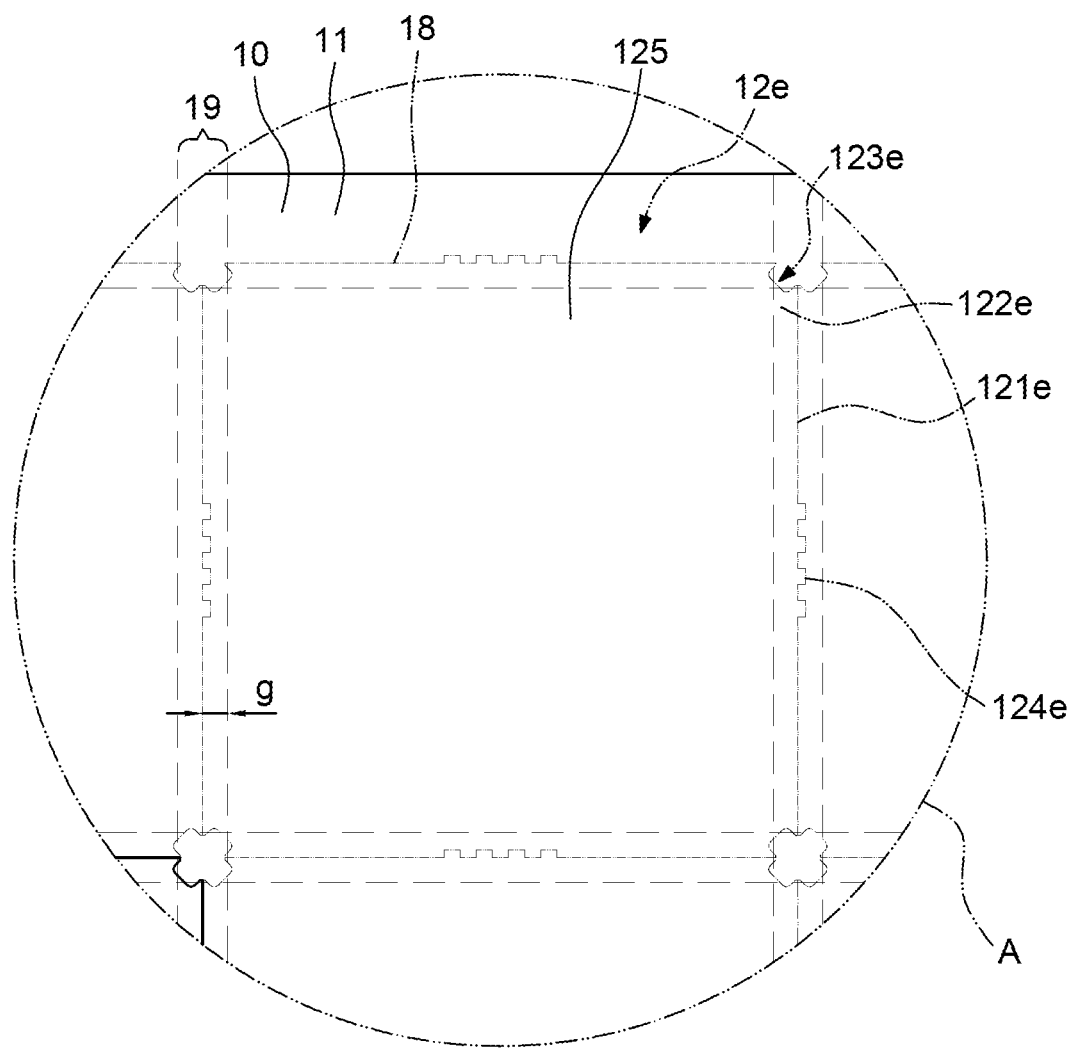
FIG. 4 illustrates an enlarged view of an area "A" shown in FIG. 1.

FIG. 4 illustrates an enlarged view of an area "A" shown in FIG. 1. FIG. 4 shows the second substrate unit 12e that is a portion of the substrate body 10. The second substrate unit 12e is defined by the imaginary cutting lines 18. If the second substrate unit 12e is found as a defective unit or a bad unit that fails to pass the testing (e.g., electrical testing and/or functional testing), it will be marked as an unqualified unit or a "NG" unit, and will be cut away from the substrate body 10 along the imaginary cutting lines 18. Then, it will be replaced by a qualified unit (or a known good unit) (e.g., the detachable first substrate unit (e.g., the first substrate unit 22a, 22b)) that is cut from a compensation substrate structure. In some embodiments, the size, the dimension and the profile of the second substrate unit 12e may be substantially the same as a size, a dimension and a profile of the detachable first substrate unit 22a (FIG. 3). The second substrate unit 12e includes four imaginary corners 122e, four imaginary first engagement portions 123e, four imaginary first sawtooth portions 124e and an effective area 125. The second substrate unit 12e has four imaginary sidewalls 121e. Each of the imaginary sidewalls 121e is disposed between two imaginary corners 122e. Each of the imaginary first engagement portions 123e is disposed at each of the imaginary corners 122e of the second substrate unit 12e. The size and the profile of the imaginary first engagement portion 123e is the same as the size and the profile of the first engagement portion 223a of the first substrate unit 22a of FIG. 3. The size and the profile of the imaginary first sawtooth portions 124e is the same as the size and the profile of the first sawtooth portions 224a of the first substrate unit 22a of FIG. 3.

The effective area 125 of the second substrate unit 12e is defined by the singulation streets 19. It is noted that the electrical elements (e.g., semiconductor die, passive device or circuit layer) are disposed within the effective area 125. After a molding process, the second substrate unit 12e and an encapsulant that covers the electrical elements (e.g., semiconductor die, passive device or circuit layer) on the second substrate unit 12e will be singulated along the singulation streets 19 to form a package structure. Therefore, the effective area 125 is the area that remains in the package structure. As shown in FIG. 4, there is a gap g between the imaginary cutting line 18 and the effective area 125 (or the singulation street 19). The gap g is greater than zero. For example, the gap g may be greater than 0.1 mm, greater than 0.5 mm, or greater than 1.0 mm.

Figure 5:
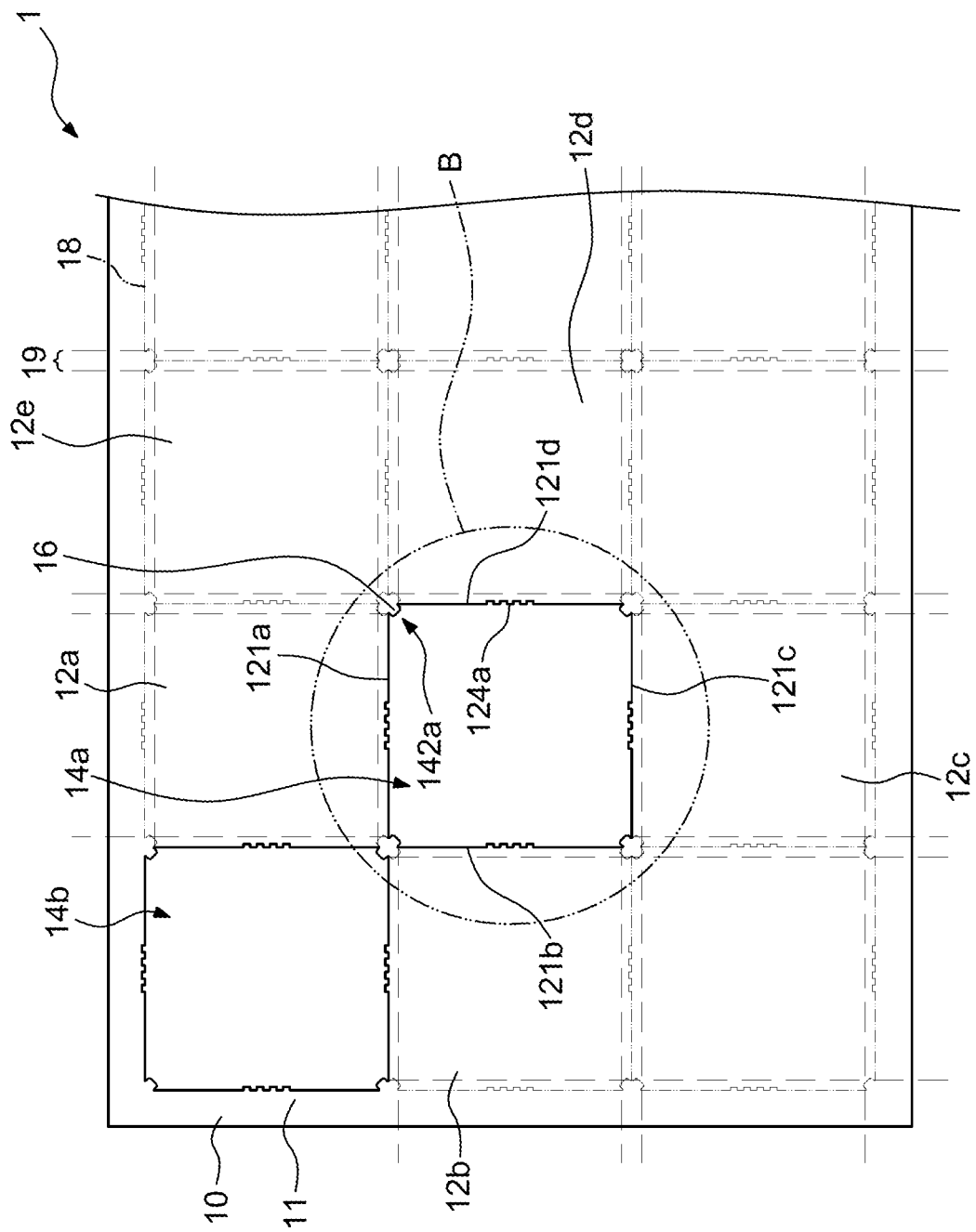
FIG. 5 illustrates a top view of the substrate structure of FIG. 1 and FIG. 2, wherein the detachable first substrate unit are omitted for the purpose of the clear explanation.
Figure 6:
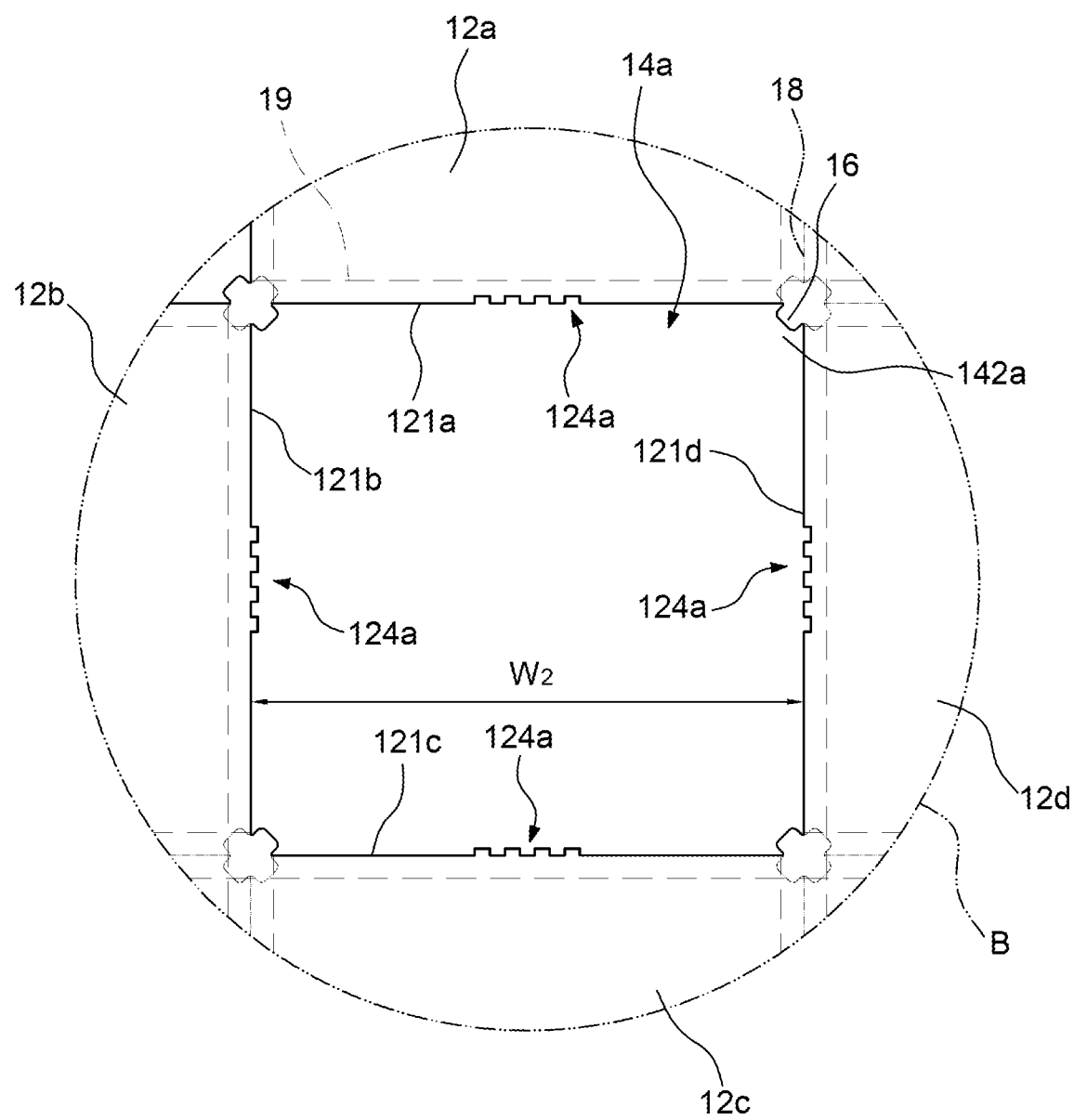
FIG. 6 illustrates an enlarged view of an area "B" shown in FIG. 5.

FIG. 5 illustrates a top view of the substrate structure 1 of FIG. 1 and FIG. 2, wherein the detachable first substrate unit (e.g., the first substrate unit 22a, 22b) are omitted for the purpose of the clear explanation. FIG. 6 illustrates an enlarged view of an area "B" shown in FIG. 5. FIG. 6 shows the opening 14a that is a portion of the substrate body 10 and is used for receiving the first substrate unit 22a. The opening 14a is substantially defined by the sidewalls 121a, 121b, 121c, 121d of the second substrate units 12a, 12b, 12c, 12d. That is, the sidewalls 121a, 121b, 121c, 121d of the second substrate units 12a, 12b, 12c, 12d are the sidewalls of the opening 14a. The second sawtooth portions 124a are disposed on the sidewalls 121a, 121b, 121c, 121d of the second substrate units 12a, 12b, 12c, 12d. Each of the second engagement portions 16 is disposed at each of the corners 142a of the opening 14a. As shown in FIG. 6, the second engagement portion 16 is a protrusion portion that corresponds to the first engagement portion 223a (FIG. 3) of the detachable first substrate unit 22a. As shown in FIG. 6, the shape of the second engagement portion 16 is a square or a trapezoid. However, in other embodiment, the shape of the second engagement portion 16 may be other shape such as a triangle or a semicircle. Furthermore, each of the second sawtooth portions 124a corresponds to each of the first sawtooth portions 224a (FIG. 3) of the detachable first substrate unit 22a. As shown in FIG. 6, the shape of the tooth of the second sawtooth portions 124a is a square. However, in other embodiment, the shape of the tooth of the second sawtooth portions 124a may be other shape such as a triangle or a semicircle. As shown in FIG. 6, the shape of the opening 14a is a square that has a width $W_2$. However, in other embodiment, the shape of the opening 14a may be other shape.

Figure 7:
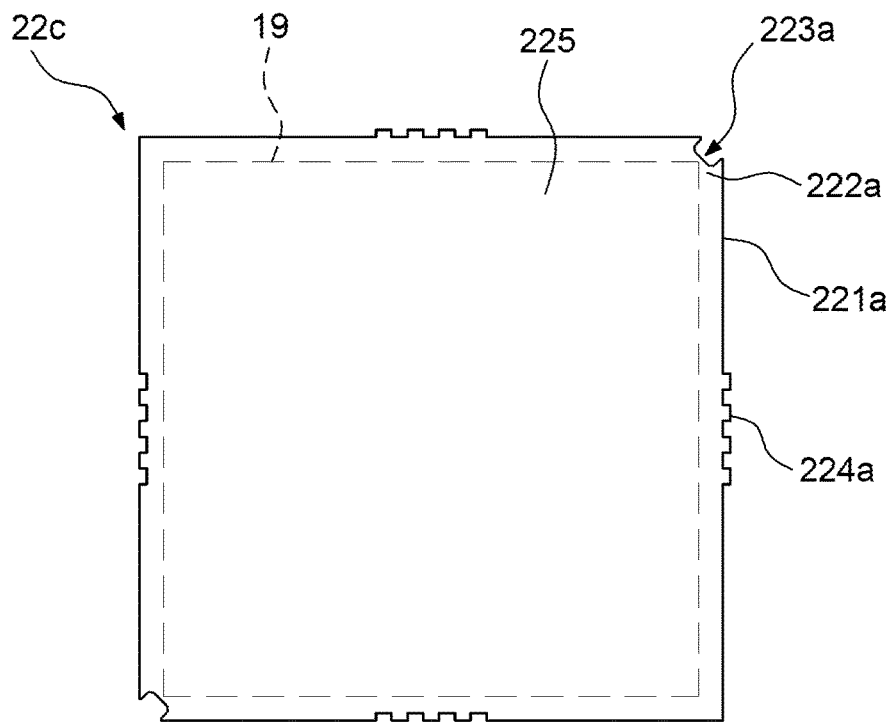
FIG. 7 illustrates a top view of a first substrate unit according to one or more embodiments of the present disclosure.

FIG. 7 illustrates a top view of a first substrate unit 22c according to one or more embodiments of the present disclosure. The first substrate unit 22c can be similar to the first substrate unit 22a as shown in FIG. 3, except for the number of the first engagement portions 223a. As shown in FIG. 7, the first substrate unit 22c includes, or consists of, two first engagement portions 223a that are disposed at diagonally opposite corners 222a.

Figure 8:
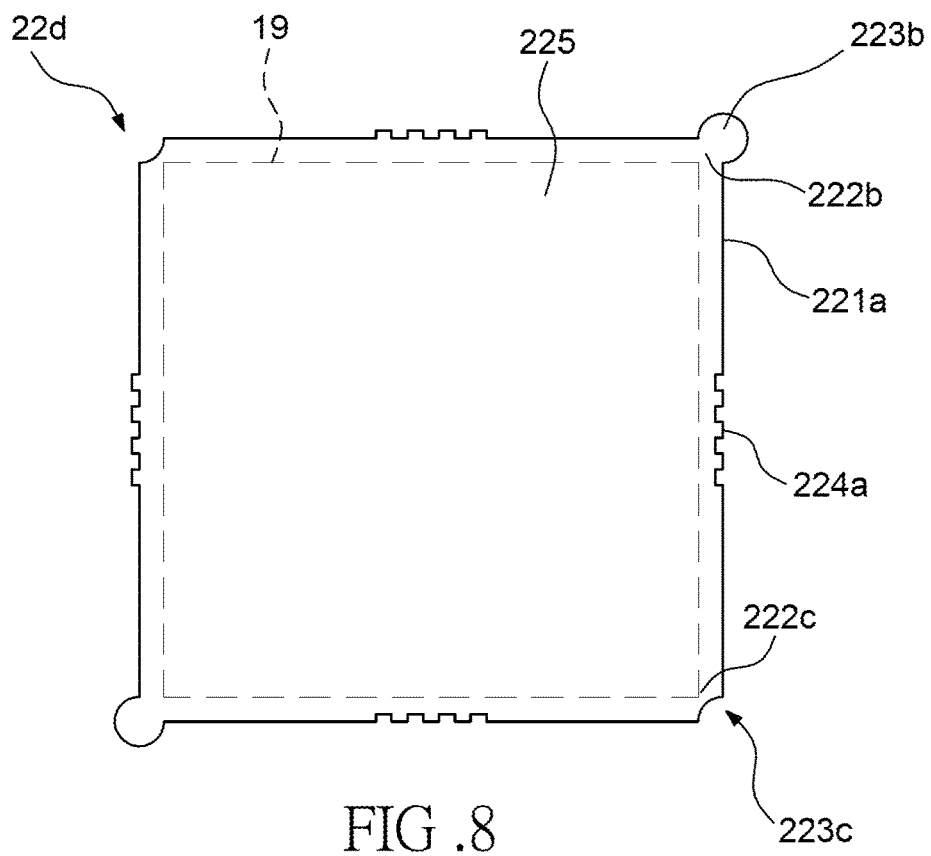
FIG. 8 illustrates a top view of a first substrate unit according to one or more embodiments of the present disclosure.

FIG. 8 illustrates a top view of a first substrate unit 22d according to one or more embodiments of the present disclosure. The first substrate unit 22d can be similar to the first substrate unit 22a as shown in FIG. 3, except for the profiles of the first engagement portions 223b, 223c. As shown in FIG. 8, the first substrate unit 22d includes two first engagement portions 223b and two first engagement portions 223c. The first engagement portions 223b are disposed at diagonally opposite corners 222b, and the first engagement portions 223c are disposed at diagonally opposite corners 222c. The first engagement portions 223b is a protrusion portion such as a profile of a three-fourth circle or a semicircle. The first engagement portions 223c is a recess portion such as a profile of a fourth circle.

Figure 9:
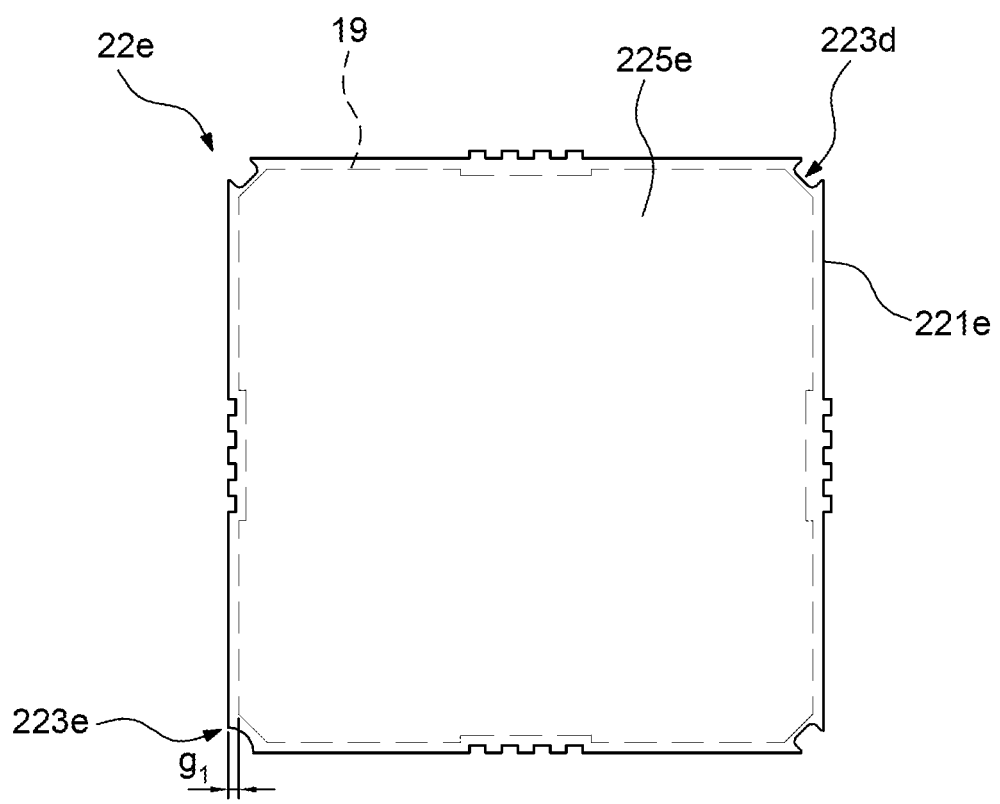
FIG. 9 illustrates a top view of a first substrate unit according to one or more embodiments of the present disclosure.

FIG. 9 illustrates a top view of a first substrate unit 22e according to one or more embodiments of the present disclosure. The first substrate unit 22e can be similar to the first substrate unit 22a as shown in FIG. 3, except for the profiles of the first engagement portions 223d, 223e and the profile of the effective area 225e. As shown in FIG. 9, the first substrate unit 22e includes three first engagement portions 223d, a first engagement portion 223e, four sidewalls 221e and the effective area 225e. The profile of the first engagement portion 223d is the same as the profile of the first engagement portions 223a of FIG. 3. The profile of the first engagement portion 223e is different from the profile of the first engagement portion 223d. That is, the first engagement portions 223d, 223e of the first substrate unit 22e have different profiles. For example, the profile of the first engagement portions 223e may be a semicircle. In addition, the edges of the effective area 225e are very close to the sidewalls 221e so that the area of the effective area 225e is increased. For example, a gap $g_1$ between the sidewall 221e and the edge of the effective area 225e (or the singulation street 19) may be less than 1.0 mm, less than 0.5 mm, or less than 0.5 mm. The effective area 225e has four chamfers at its corners. Each of the chamfers corresponds to each of the first engagement portions 223d, 223e. Thus, the effective area 225e is substantially an octagon.

Figure 10:
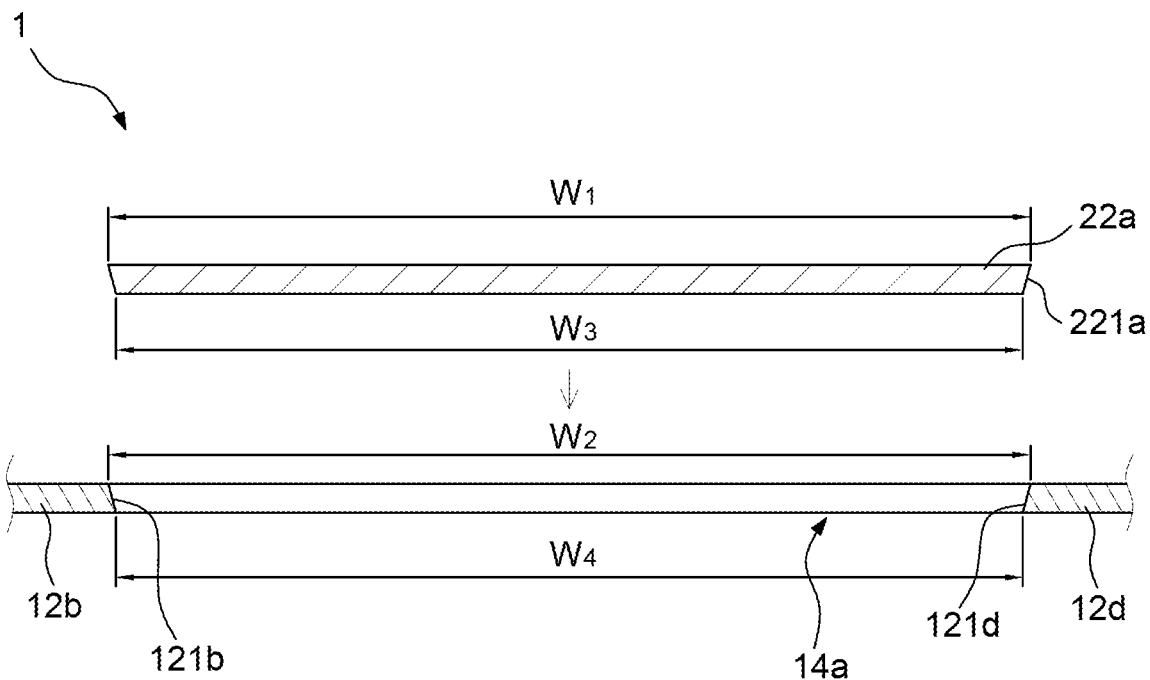
FIG. 10 illustrates a cross-sectional view of a portion of the substrate structure of FIG. 2.
Figure 11:
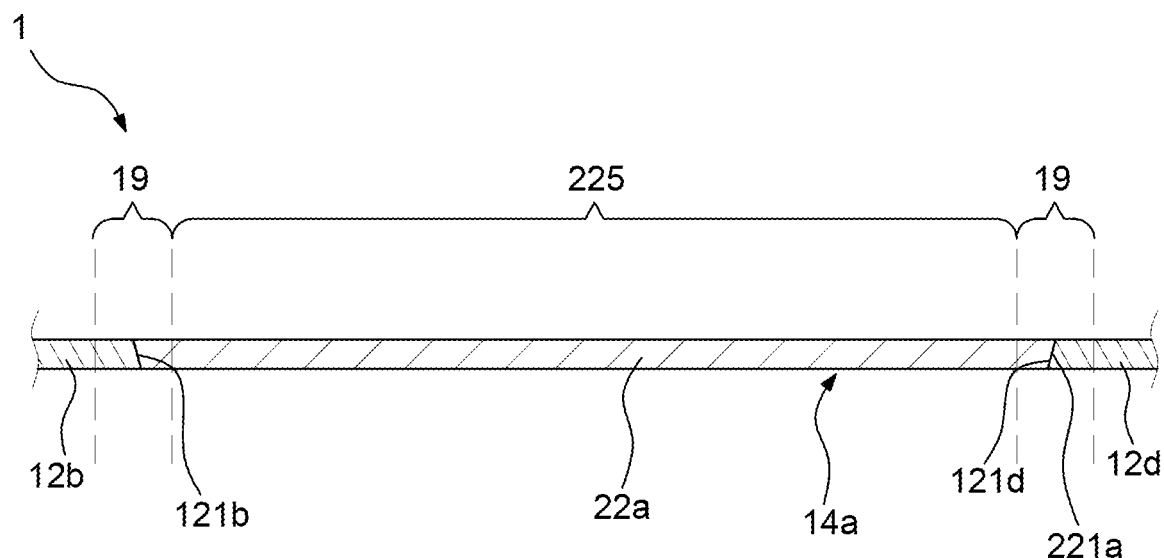
FIG. 11 illustrates a cross-sectional view of a portion of the substrate structure of FIG. 1.

FIG. 10 illustrates a cross-sectional view of a portion of the substrate structure 1 of FIG. 2. FIG. 11 illustrates a cross-sectional view of a portion of the substrate structure 1 of FIG. 1. As shown in FIG. 10, the sidewalls 121b, 121d of the opening 14a are slanted, and the sidewall 221a of the detachable first substrate unit 22a is slanted. The opening 14a is tapered from a top side to a bottom side thereof, thus, the width $W_2$ of the top side (e.g., a maximum width) of the opening 14a is greater than the width $W_4$ of the bottom side (e.g., a minimum width) of the opening 14a. Furthermore, the detachable first substrate unit 22a is also tapered from a top side to a bottom side thereof, thus, the width $W_1$ of the top side (e.g., a maximum width) of the detachable first substrate unit 22a is greater than the width $W_3$ of the bottom side (e.g., a minimum width) of the detachable first substrate unit 22a. The slope of the sidewalls 121b, 121d of the opening 14a is substantially equal to the slope of the sidewall 221a of the detachable first substrate unit 22a, and the maximum width $W_1$ of the detachable first substrate unit 22a is greater than the minimum width $W_4$ of the opening 14a, so that the sidewalls 121b, 121d of the opening 14a can receive the sidewall 221a of the detachable first substrate unit 22a. In one embodiment, the width $W_2$ of the top side and the width $W_4$ of the bottom side of the opening 14a are substantially equal to the width $W_1$ of the top side and the width $W_3$ of the bottom side of the detachable first substrate unit 22a, respectively. However, in other embodiment, the width $W_1$ of the top side of the detachable first substrate unit 22a may be greater than the width $W_2$ of the top side of the bottom side of the opening 14a by 20 µm, so that the detachable first substrate unit 22a can be disposed in the opening 14a tightly.

FIG. 12 illustrates a top view of a substrate structure 3 according to one or more embodiments of the present disclosure. FIG. 13 illustrates a perspective explosive view of the substrate structure 3 of FIG. 12. The substrate structure 3 may be a PBGA substrate. The PBGA substrate structure 3 includes a plurality of slot holes 33 disposed between the substrate units (for example, the substrate units 32a, 32b, 32c, 32e). Thus, the substrate units (for example, the substrate units 32a, 32b, 32c, 32e) are separated by the slot holes 33, and are connected to the frame 31 of the PBGA substrate structure 3 through connecting bars 35. There may be a gap between the side surface of one substrate unit and the side surface of the adjacent substrate unit. For example, there is a gap between the side surface 321b of the substrate unit 32b and the side surface 321e of the adjacent substrate unit 32e. In addition, the corners of the substrate units (for example, the substrate units 32a, 32b, 32c, 32e) do not contact the adjacent substrate units of the frame 31.

Referring to FIG. 12 and FIG. 13, the substrate structure 3 includes at least one detachable first substrate unit (e.g., the first substrate units 42a, 42b) and a substrate body 30. The detachable first substrate units 42a, 42b are compensation qualified units (or compensation known good units) that are cut from a compensation substrate structure. For example, the detachable first substrate unit 42a includes a plurality of sidewalls 421a (e.g., four sidewalls 421a), a plurality of first engagement portions (e.g., four first engagement portions 423) and a plurality of first gripping portions (e.g., two first gripping portions 424 and two first gripping portions 426). The detachable first substrate unit 42a has a plurality of sidewalls 421a (e.g., four sidewalls 421a). Two first engagement portions 423 are disposed on one sidewall 421a, two first gripping portions 424 are disposed on one sidewall 421a and two first gripping portions 426 are disposed on one sidewall 421a. It is noted that a size, a dimension and a profile of the detachable first substrate units 42b may be substantially the same as a size, a dimension and a profile of the detachable first substrate units 42a. The material of the detachable first substrate unit (e.g., the first substrate units 42a, 42b) may include a glass-reinforced epoxy resin material (e.g., FR4), bismaleimide triazine ("BT"), epoxy, silicon, print circuit board ("PCB") material, glass or ceramic.

The material of the substrate body 30 may be the same as or different from the material of the detachable first substrate unit (e.g., the first substrate units 42a, 42b). For example, the material of the substrate body 30 may include a glass-reinforced epoxy resin material (e.g., FR4), bismaleimide triazine ("BT"), epoxy, silicon, print circuit board ("PCB") material, glass or ceramic. As shown in FIG. 12 and FIG. 13, the substrate body 30 includes a frame 31, a plurality of slot holes 33, a plurality of second substrate units (e.g., the second substrate units 32a, 32b, 32c, 32e), at least one opening (e.g., the openings 34a, 34b), a plurality of second engagement portions (e.g., four second engagement portions 361), a plurality of second gripping portions (e.g., two second gripping portions 362 and two second gripping portions 363), a plurality of imaginary cutting lines 18 and a plurality of singulation streets 19. The frame 31 surrounds the second substrate units (e.g., the second substrate units 32a, 32b, 32c, 32e) and the detachable first substrate unit (e.g., the first substrate units 42a, 42b). The slot holes 33 are disposed on the frame 31 to define the second substrate unit (e.g., the second substrate units 32a, 32b, 32c, 32e).

The second substrate units (e.g., the second substrate units 32a, 32b, 32c, 32e) are defined by the imaginary cutting lines 18 and halves of the slot holes 33. If some of the second substrate units are found as defective units or bad units that fail to pass the testing (e.g., electrical testing and/or functional testing), they will be marked as unqualified units or "NG" units, and will be cut away along the imaginary cutting lines 18 and the slot holes 33. Then, they will be replaced by qualified units (or known good units) that are cut from a compensation substrate structure. As shown in FIG. 12, the slot holes are disposed between the second substrate units (e.g., the second substrate units 32b, 32e, 32c), between the second substrate units (e.g., the second substrate units 32a, 32b, 32c, 32e) and the frame 31, between the detachable first substrate unit (e.g., the first substrate units 42a, 42b) and the frame 31, and between the second substrate unit (e.g., the second substrate units 32a) and the detachable first substrate unit (e.g., the first substrate units 42a, 42b).

As shown in FIG. 12 and FIG. 13, the second substrate unit 32a has sidewalls 321a, the second substrate unit 32b has sidewalls 321b, and the second substrate unit 32e has sidewalls 321e. The opening 34a is substantially defined by at least one sidewall (e.g., the sidewall 321a) of the second substrate unit (e.g., the second substrate unit 32a) and at least two sidewalls (e.g., three sidewalls 311) of the frame 31. That is, the sidewall (e.g., the sidewall 321a) of the second substrate unit (e.g., the second substrate unit 32a) and the sidewalls (e.g., the three sidewalls 311) of the frame 31 are the sidewalls of the opening 34a. The second gripping portions 362 are disposed on the sidewall (e.g., the sidewall 321a) of the second substrate unit (e.g., the second substrate unit 32a), and the second gripping portions 363 are disposed on the sidewall (e.g., the sidewall 311) of the frame 31.

In one or more embodiments, a size of the second substrate unit (e.g., the second substrate unit 32a, 32b, 32c, 32e) may be substantially different from a size of the opening (e.g., the opening 14a, 14b). Furthermore, a size of the detachable first substrate unit (e.g., the first substrate units 42a, 42b) may be substantially different from the size of the opening (e.g., the opening 14a, 14b). In one or more embodiments, a width $W_5$ (FIG. 14) of the detachable first substrate unit 42 may be substantially less than a width $W_6$ (FIG. 16) of the opening 34a.

As shown in FIG. 12, when the detachable first substrate unit (e.g., the first substrate unit 42a, 42b) is disposed in the opening (e.g., the opening 34a, 34b), the second engagement portions 361 are engaged with the first engagement portions 423, the second gripping portions 362 are engaged with first gripping portions 424, and the second gripping portions 363 are engaged with first gripping portions 426. Therefore, the failure rate of the substrate structure 3 is improved. In addition, the substrate body 30 may hold the compensation qualified detachable first substrate unit (e.g., the first substrate unit 42a, 42b) tightly, that is, the detachable first substrate unit (e.g., the first substrate unit 42a, 42b) may be disposed in the opening (e.g., the opening 34a, 34b) securely. The engagement force between the detachable first substrate unit (e.g., the first substrate unit 42a, 42b) and the substrate body 30 may be relatively high, and the first substrate unit (e.g., the first substrate unit 42a, 42b) may not fall off from the substrate body 30 readily.

Figure 14:
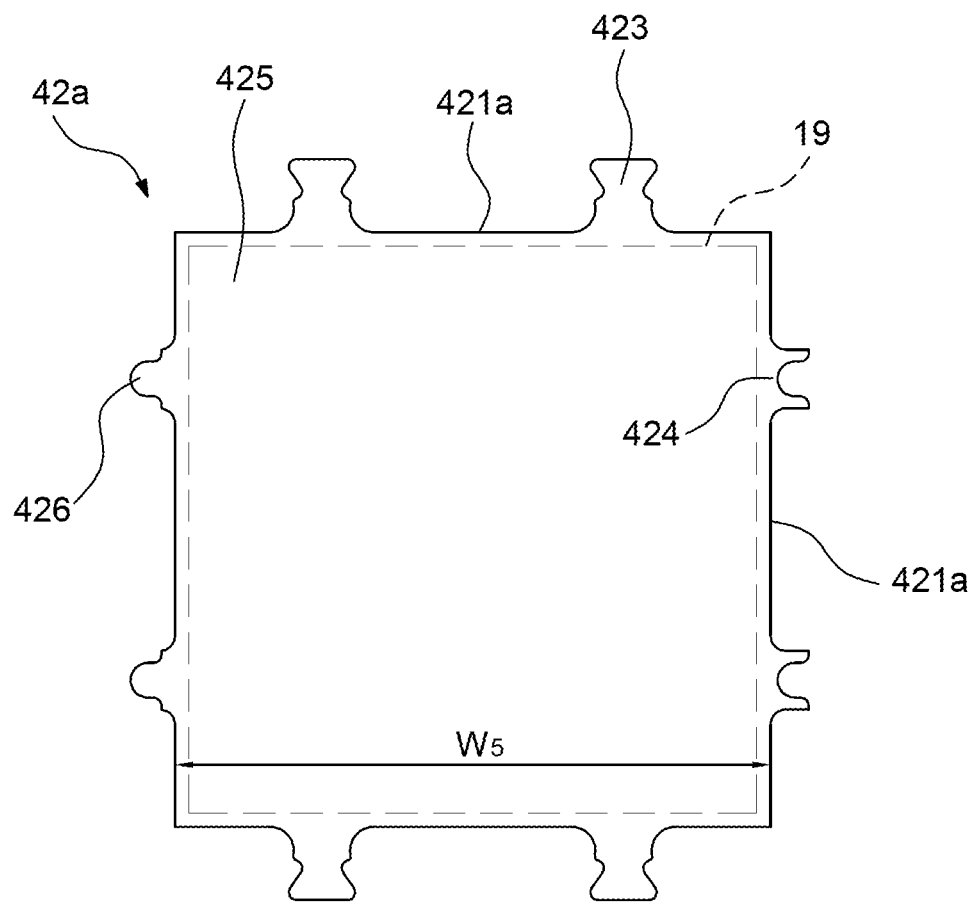
FIG. 14 illustrates a top view of a first substrate unit of FIG. 12 and FIG. 13.

FIG. 14 illustrates a top view of a first substrate unit 42a of FIG. 12 and FIG. 13. The first substrate unit 42a includes the four sidewalls 421a, the four first engagement portions 423, the two first gripping portions 424, the two first gripping portions 426 and an effective area 425. The first engagement portions 423 and the first gripping portions 424, 426 are disposed on the sidewalls 421a. The first engagement portion 423 is a protrusion portion with a trapezoid end, the first gripping portion 424 is a clamping portion, and the first gripping portion 426 is a protrusion portion with a semi-circular end. As shown in FIG. 14, the shape of the detachable first substrate unit 42a is a substantially square that has a width $W_5$. However, in other embodiment, the shape of the detachable first substrate unit 42a may be other shape. In addition, the effective area 425 is defined by the singulation streets 19, and the first engagement portions 423 and the first gripping portions 424, 426 are disposed outside the effective area 425. It is noted that the electrical elements (e.g., semiconductor die, passive device or circuit layer) are disposed within the effective area 425. After a molding process, the first substrate unit 42a and an encapsulant that covers the electrical elements (e.g., semiconductor die, passive device or circuit layer) on the first substrate unit 42a will be singulated along the singulation streets 19 to form a package structure. Therefore, the effective area 425 is the area that remains in the package structure.

Figure 15:
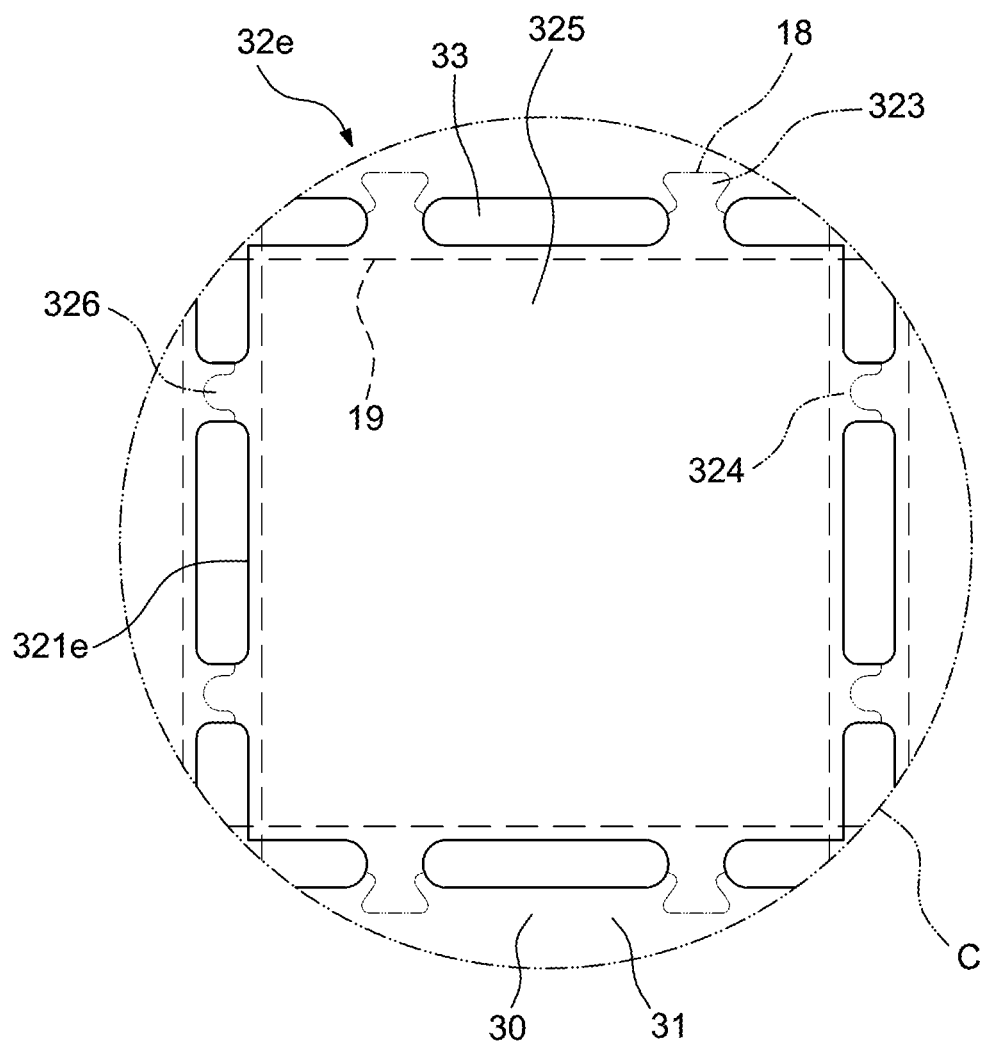
FIG. 15 illustrates an enlarged view of an area "C" shown in FIG. 12.

FIG. 15 illustrates an enlarged view of an area "C" shown in FIG. 12. FIG. 15 shows the second substrate unit 32e that is a portion of the substrate body 30. The second substrate unit 32e is defined by the imaginary cutting lines 18 and halves of the slot holes 33. If the second substrate unit 32e is found as a defective unit or a bad unit that fails to pass the testing (e.g., electrical testing and/or functional testing), it will be marked as an unqualified unit or a "NG" unit, and will be cut away from the substrate body 30 along the imaginary cutting lines 18 and the slot holes 33. Then, it will be replaced by a qualified unit (or a known good unit) (e.g., the detachable first substrate unit (e.g., the first substrate unit 42a, 42b)) that is cut from a compensation substrate structure. In some embodiments, the size, the dimension and the profile of the second substrate unit 32e may be substantially the same as a size, a dimension and a profile of the detachable first substrate unit 42a (FIG. 14). The second substrate unit 12e includes four sidewalls 321e, four imaginary first engagement portions 323, two imaginary first gripping portions 324 and two imaginary first gripping portions 326 and an effective area 325.

The imaginary first engagement portions 323 and the imaginary first gripping portions 324, 326 are disposed on the sidewalls 321e. The size and the profile of the imaginary first engagement portion 323 is the same as the size and the profile of the first engagement portion 423 of the first substrate unit 42a of FIG. 14. The sizes and the profiles of the imaginary first gripping portions 324, 326 are the same as the size and the profile of the first gripping portions 424, 426 of the first substrate unit 42a of FIG. 14, respectively.

The effective area 325 of the second substrate unit 32e is defined by the singulation streets 19. It is noted that the electrical elements (e.g., semiconductor die, passive device or circuit layer) are disposed within the effective area 325. After a molding process, the second substrate unit 32e and an encapsulant that covers the electrical elements (e.g., semiconductor die, passive device or circuit layer) on the second substrate unit 32e will be singulated along the singulation streets 19 to form a package structure. Therefore, the effective area 325 is the area that remains in the package structure.

Figure 16:
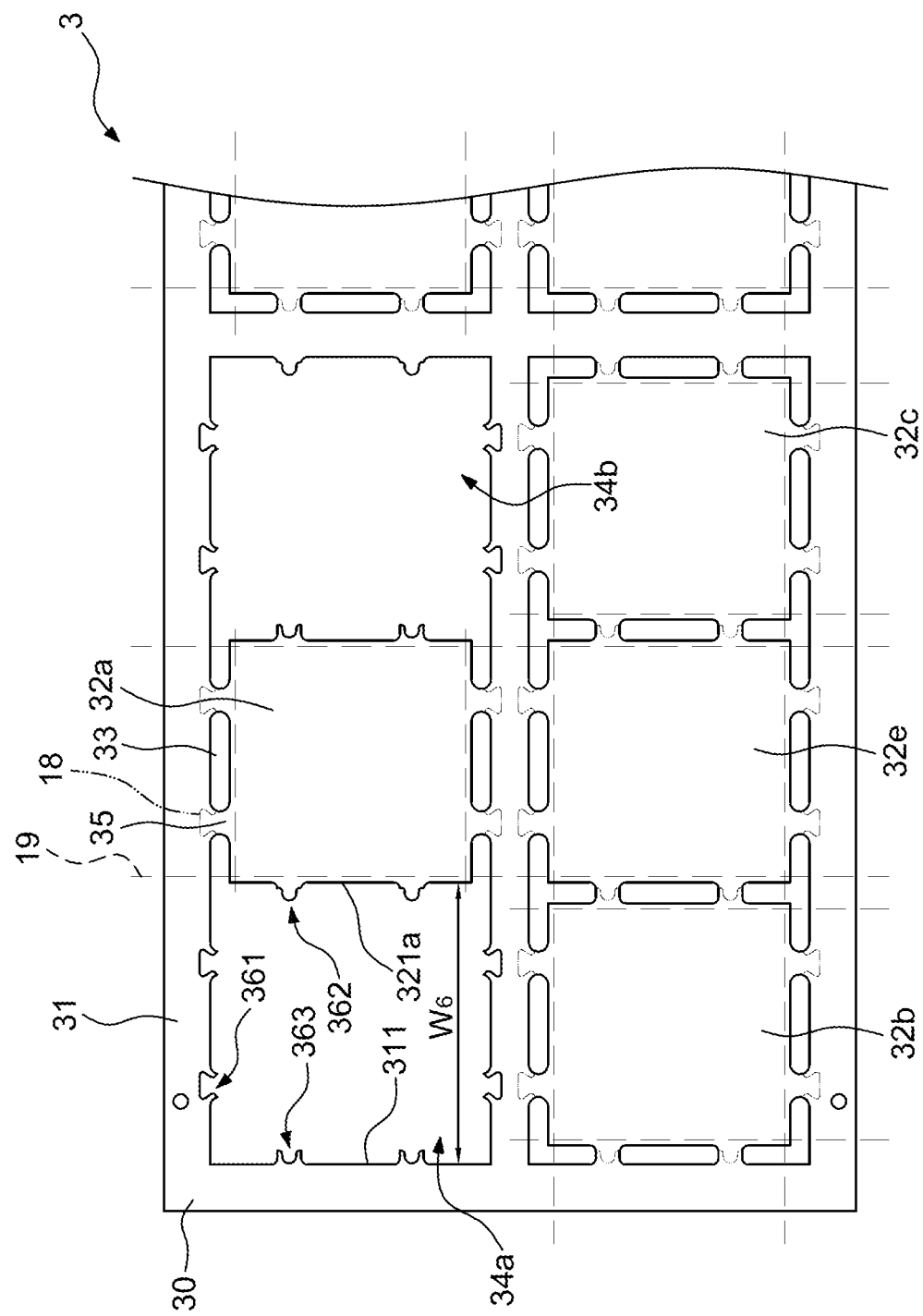
FIG. 16 illustrates a top view of the substrate structure of FIG. 12 and FIG. 13, wherein the detachable first substrate unit are omitted for the purpose of the clear explanation.

FIG. 16 illustrates a top view of the substrate structure 3 of FIG. 12 and FIG. 13, wherein the detachable first substrate unit (e.g., the first substrate unit 42a, 42b) are omitted for the purpose of the clear explanation. FIG. 16 shows the opening 34a that is a portion of the substrate body 30 and is used for receiving the first substrate unit 42a.

The opening 34a is substantially defined by at least one sidewall (e.g., the sidewall 321a) of the second substrate unit (e.g., the second substrate unit 32a) and at least two sidewalls (e.g., three sidewalls 311) of the frame 31. That is, the sidewall (e.g., the sidewall 321a) of the second substrate unit (e.g., the second substrate unit 32a) and the sidewalls (e.g., the three sidewalls 311) of the frame 31 are the sidewalls of the opening 34a. The second engagement portions 361 are disposed on the sidewalls (e.g., the three sidewalls 311) of the frame 31. The second gripping portions 362 are disposed on the sidewall (e.g., the sidewall 321a) of the second substrate unit (e.g., the second substrate unit 32a), and the second gripping portions 363 are disposed on the sidewall (e.g., the sidewall 311) of the frame 31. As shown in FIG. 16, the second engagement portion 361 is a recess portion that corresponds to the first engagement portion 423 (FIG. 14) of the detachable first substrate unit 42a. As shown in FIG. 16, the shape of the second engagement portion 361 is a square or a trapezoid. However, in other embodiment, the shape of the second engagement portion 361 may be other shape such as a triangle or a semicircle. Furthermore, each of the second gripping portions 362 corresponds to each of the first gripping portions 424 (FIG. 14) of the detachable first substrate unit 42a, and each of the second gripping portions 363 corresponds to each of the first gripping portions 426 (FIG. 14) of the detachable first substrate unit 42a. In addition, the shape of the opening 34a is a substantially square that has a width $W_6$. The width $W_6$ of the opening 34a is greater than the width $W_5$ of the detachable first substrate unit 42a (FIG. 14). It is understood that the width $W_6$ of the opening 34a may be a total width of the width $W_5$ of the detachable first substrate unit 42a (FIG. 14) and a width of the slot hole 33.

Figure 17:
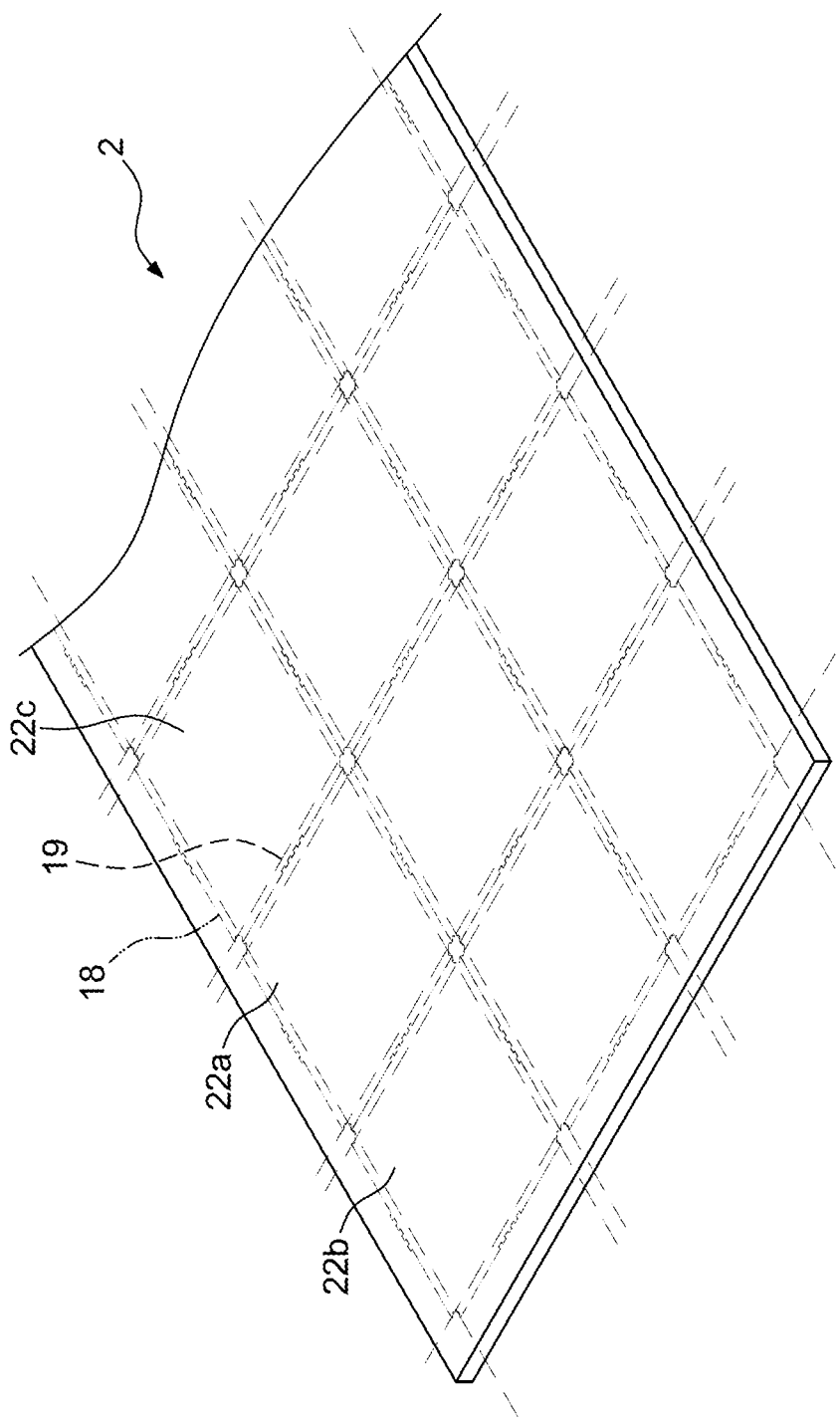
FIG. 17 illustrates one or more stages of an example of a manufacturing process according to some embodiments of the present disclosure.

FIGS. 17-24 illustrate a manufacturing process according to one or more embodiments of the present disclosure. Referring to FIG. 17, a first substrate structure 2 is provided. In these embodiments, the first substrate structure 2 can be similar to the substrate structure 1 illustrated in FIGS. 1 and 2, wherein the first substrate structure 1 includes at least one first substrate unit (for example, including the first substrate units 22a, 22b, 22c) defined by a plurality of imaginary cutting lines 18. The first substrate structure 2 is a compensation substrate structure.

Figure 18:
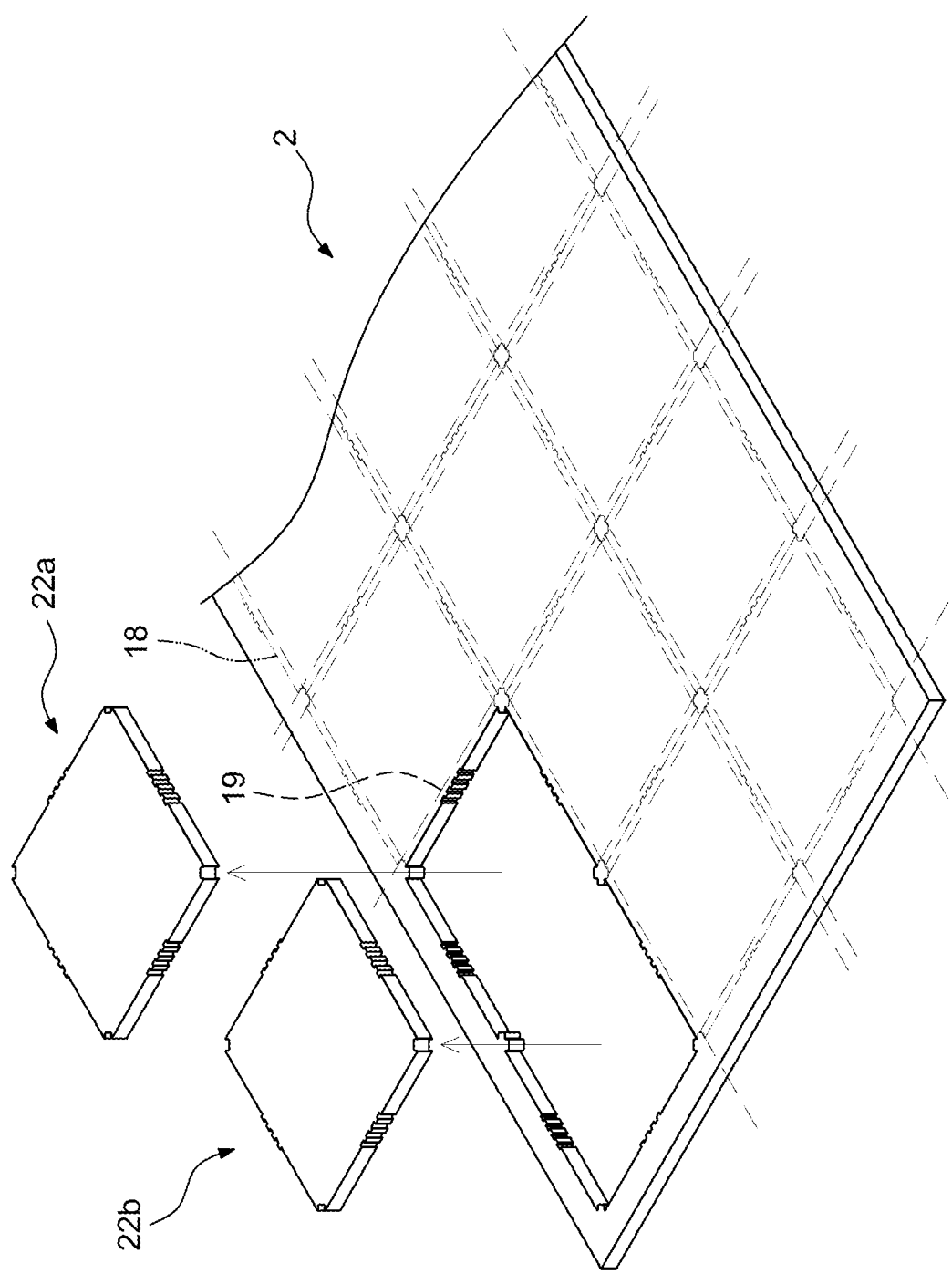
FIG. 18 illustrates one or more stages of an example of a manufacturing process according to some embodiments of the present disclosure.

Referring to FIG. 18, a testing (e.g., electrical testing and/or functional testing) is conducted to the first substrate structure 2. That is, all of the first substrate units (for example, including the first substrate units 22a, 22b, 22c) of the first substrate structure 2 are tested. Then, some of the first substrate units (for example, including the first substrate units 22a, 22b) that pass the testing will be marked as qualified units or known good units, and will be cut away along the imaginary cutting lines 18. For example, the qualified first substrate units 22a, 22b are removed from the first substrate structure 2. That is, a cutting process is conducted along the imaginary cutting lines 18 to remove the first substrate unit 22a, 22b from the first substrate structure 2 by, for example, punching or laser cutting. The qualified first substrate units 22a, 22b are referred to as compensation substrate units. For example, the qualified first substrate unit 22a is substantially the same as the first substrate unit 22a of FIG. 1 through FIG. 3. The first substrate unit 22a includes the four corners 222a, the four first engagement portions 223a, the four first sawtooth portions 224a and an effective area 225. The first substrate unit 22a has the four sidewalls 221a. Each of the sidewalls 221a is disposed between two corners 222a. Each of the first engagement portions 223a is disposed at each of the corners 222a of the first substrate unit 22a. Furthermore, each of the first sawtooth portions 224a is disposed on each of the sidewalls 221a.

Figure 19:
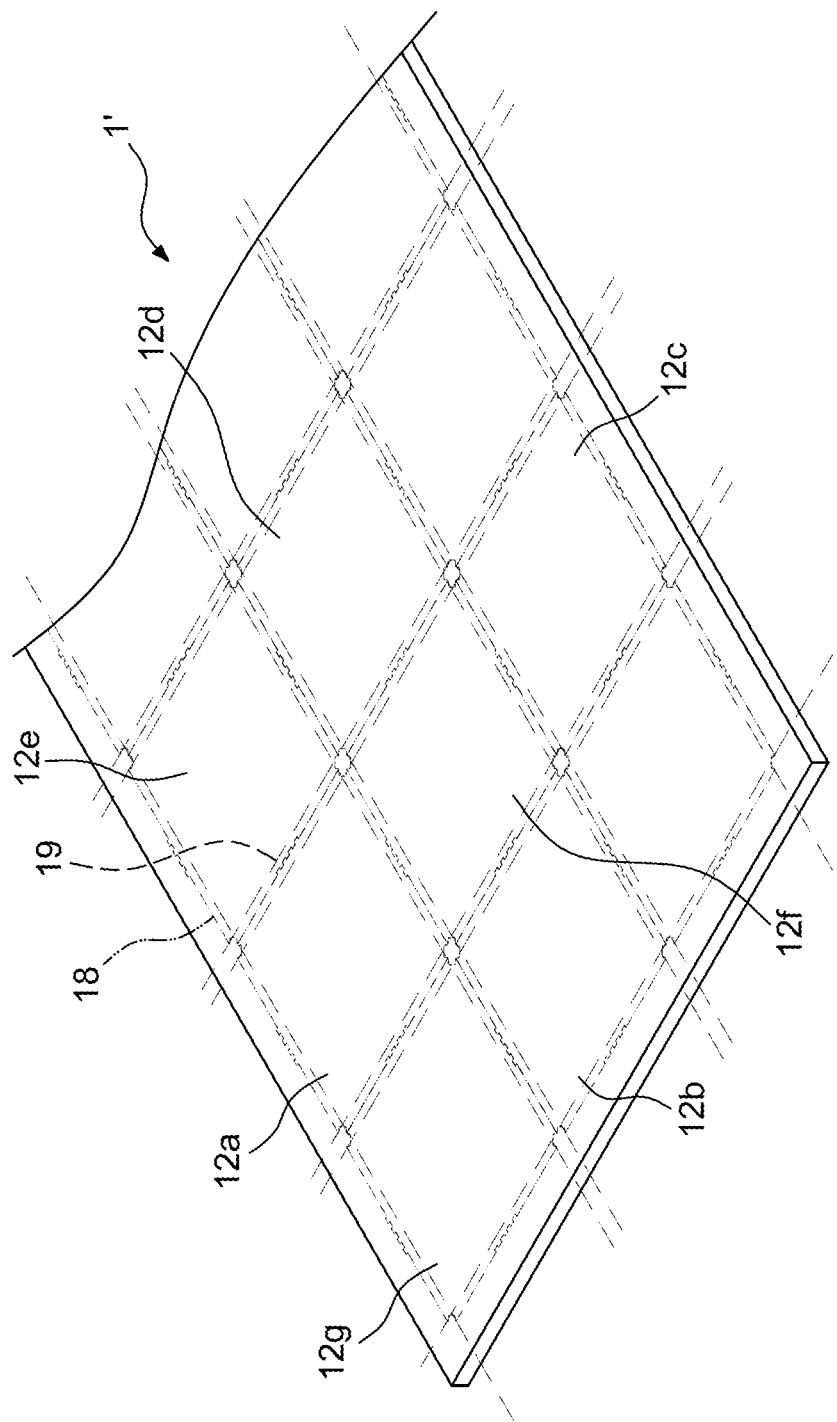
FIG. 19 illustrates one or more stages of an example of a manufacturing process according to some embodiments of the present disclosure.

Referring to FIG. 19, a second substrate structure 1' is provided. In these embodiments, the second substrate structure 1' can be similar to the substrate structure 1 illustrated in FIGS. 1 and 2, wherein the second substrate structure 1' includes a plurality of second substrate units (for example, including the second substrate units 12a, 12b, 12c, 12d, 12e, 12f, 12g) defined by a plurality of imaginary cutting lines 18.

Figure 20:
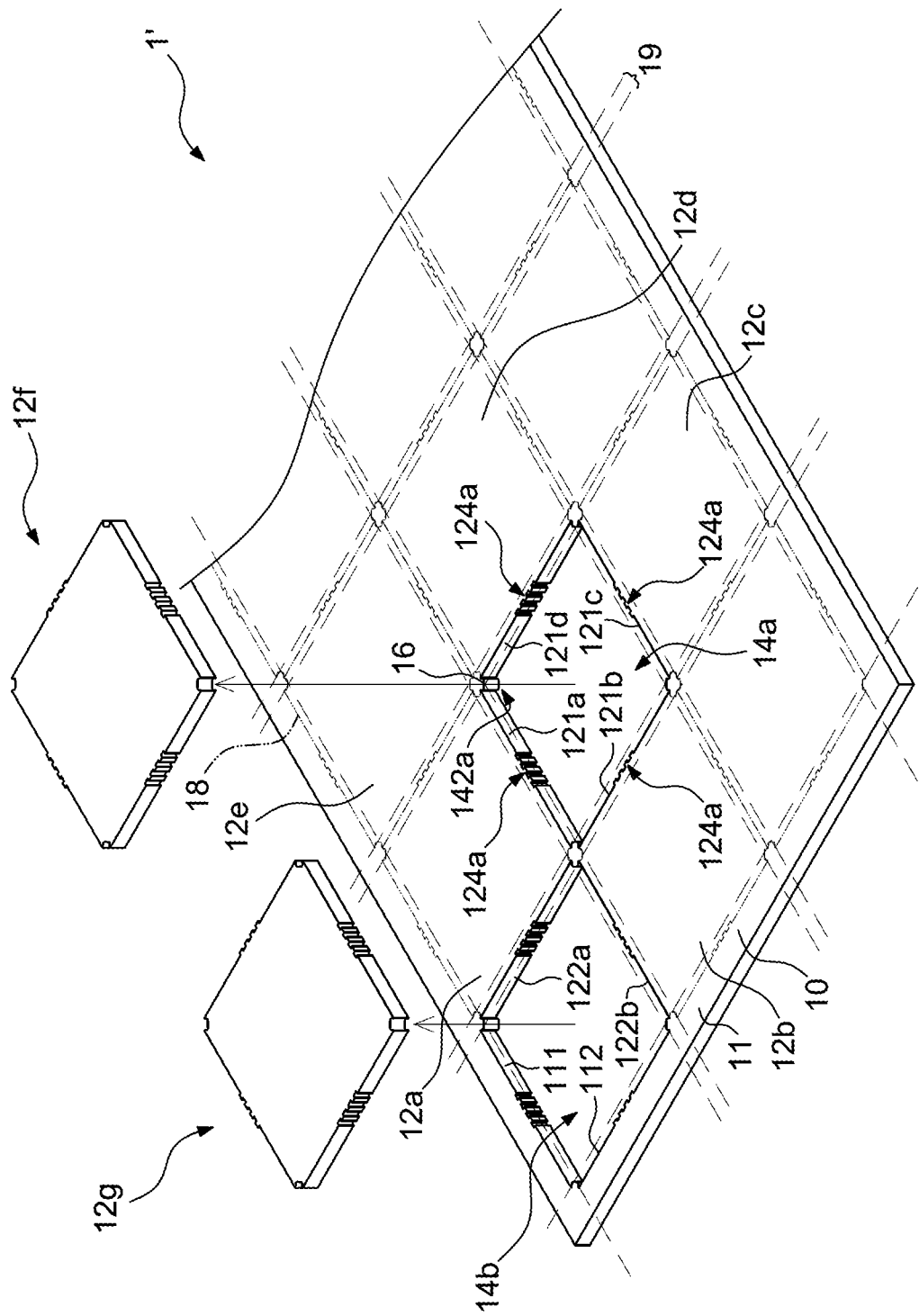
FIG. 20 illustrates one or more stages of an example of a manufacturing process according to some embodiments of the present disclosure.

Referring to FIG. 20, a testing (e.g., electrical testing and/or functional testing) is conducted to the second substrate structure 1'. That is, all of the second substrate units (for example, including the second substrate units 12a, 12b, 12c, 12d, 12e) of the second substrate structure 1' are tested.

Then, some of the second substrate units (for example, including the second substrate units 12f, 12g) are found as defective units or bad units that fail to pass the testing (e.g., electrical testing and/or functional testing). Then, they will be marked as unqualified units or "NG" units, and will be cut away along the imaginary cutting lines 18. For example, the unqualified second substrate units 12f, 12g are removed from the second substrate structure 1'. That is, a cutting process is conducted along the imaginary cutting lines 18 to remove the second substrate units 12f, 12g from the second substrate structure 1' by, for example, punching or laser cutting. The second substrate units 12f, 12g will be disregarded.

Meanwhile, at least one opening (For example, including the opening 14a, 14b), a plurality of second engagement portions 16, and a plurality of second sawtooth portions 124a are formed in the second substrate structure 1'. The opening 14a, 14b is substantially the same as the opening 14a, 14b as shown in FIG. 5 and FIG. 6. The opening 14a is substantially defined by the sidewalls 121a, 121b, 121c, 121d of the second substrate units 12a, 12b, 12c, 12d. That is, the sidewalls 121a, 121b, 121c, 121d of the second substrate units 12a, 12b, 12c, 12d are the sidewalls of the opening 14a. The second sawtooth portions 124a are disposed on the sidewalls 121a, 121b, 121c, 121d of the second substrate units 12a, 12b, 12c, 12d. Each of the second engagement portions 16 is disposed at each of the corners 142a of the opening 14a.

Figure 21:
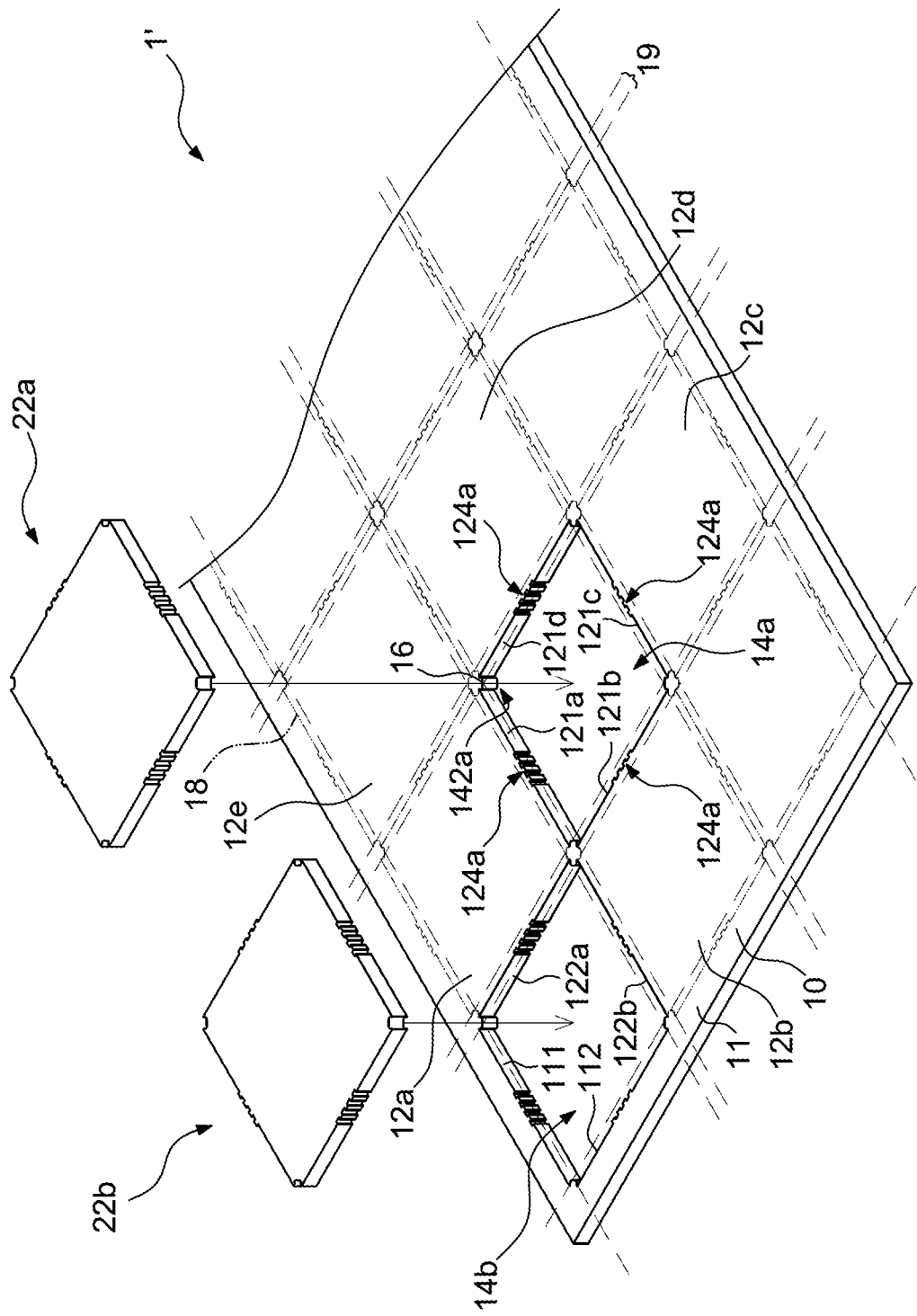
FIG. 21 illustrates one or more stages of an example of a manufacturing process according to some embodiments of the present disclosure.

Referring to FIG. 21, the qualified first substrate units 22a, 22b of FIG. 18 are disposed or placed in the opening 14a, 14b of the second substrate structure 1' so as to form the substrate structure 1 of FIG. 1 through FIG. 6. That is, the unqualified second substrate units 12f, 12g of the second substrate structure 1' of FIG. 19 and FIG. 20 are replaced by the qualified first substrate units 22a, 22b of FIG. 17 and FIG. 18. Therefore, the failure rate (or yield loss) of the substrate structure 1 is improved. When the first substrate unit (e.g., the first substrate unit 22a, 22b) is disposed in the opening (e.g., the opening 14a, 14b), the second engagement portions 16 are engaged with the first engagement portions 223a, and at least one sidewall of the detachable first substrate unit (e.g., the first substrate unit 22a, 22b) contacts the sidewall of the second substrate unit (e.g., the second substrate unit 12a, 12b, 12c, 12d). For example, the detachable first substrate unit 22a is disposed in the opening 14a, the second engagement portions 16 at the corners 142a of the opening 14a are engaged with the first engagement portions 223a at the corners 222a of the detachable first substrate unit 22a. In addition, the first sawtooth portions 224a on the sidewalls 221a of the detachable first substrate unit 22a are engaged with the second sawtooth portions 124a on the sidewalls (e.g., the sidewalls 121a, 121b, 121c, 121d) of the second substrate units (e.g., the second substrate units 12a, 12b, 12c, 12d). Therefore, the substrate body 10 may hold the compensation qualified detachable first substrate unit (e.g., the first substrate unit 22a, 22b) tightly, that is, the detachable first substrate unit (e.g., the first substrate unit 22a, 22b) may be disposed in the opening (e.g., the opening 14a, 14b) securely. The engagement force between the detachable first substrate unit (e.g., the first substrate unit 22a, 22b) and the substrate body 10 may be relatively high, and the first substrate unit (e.g., the first substrate unit 22a, 22b) may not fall off from the substrate body 10 readily.

Referring to FIG. 22, a plurality of electrical elements (e.g., semiconductor die 50, passive device 52 or circuit layer) are attached to the top surface of the second substrate structure 1' (or the substrate structure 1) within the effective areas (e.g., the effective area 225 of the first substrate unit 22a).

Referring to FIG. 23, an encapsulant 54 is applied to cover the electrical elements (e.g., semiconductor die 50, passive device 52 or circuit layer) and the second substrate structure 1' (or the substrate structure 1). Since the substrate structure 1 is a matrix array BGA substrate or a grid array BGA substrate, the encapsulant 54 will cover all the substrate units on one side of the substrate structure 1 during a molding process. For example, before the molding process, the substrate structure 1 may be disposed or accommodated in one cavity of a mold chase. The substrate structure 1 may have a single molding gate, thus, during the molding process, the encapsulant 54 may flow through the molding gate to enter the cavity of a mold chase, and cover all the substrate units concurrently. The encapsulant 54 is formed concurrently and integrally.

Referring to FIG. 24, a singulation process is conducted to form a plurality of package structures 5 along the singulation streets 19 of the second substrate structure 1' (or the substrate structure 1). It is noted that the effective area (e.g., the effective area 225) is the area that remains in the package structure 5.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   at least one detachable first substrate unit including a plurality of corners and a plurality of first engagement portions, wherein each of the first engagement portions is disposed at each of the corners of the detachable first substrate unit; and
   a substrate body including a plurality of second substrate units, a frame surrounding the second substrate units, at least one opening and a plurality of second engagement portions, wherein the opening is substantially defined by a plurality of sidewalls of the second substrate units, the opening includes a plurality of corners, each of the second engagement portions is disposed at each of the corners of the opening, the detachable first substrate unit is disposed in the opening, and the second engagement portions are engaged with the first engagement portions,
   wherein at least one of the second substrate units is between the at least one opening and the frame of the substrate body, a sidewall of the opening is slanted, a sidewall of the detachable first substrate unit is slanted, and the sidewall of the opening receives the sidewall of the detachable first substrate unit.

2. The substrate structure according to claim 1, wherein the sidewalls of the at least one of the second substrate units are sidewalls of the opening.

3. The substrate structure according to claim 1, wherein a sidewall of the detachable first substrate unit contacts the sidewall of the second substrate unit.

4. The substrate structure according to claim 1, wherein the first engagement portion is a recess portion recessed inward from the corner of the detachable first substrate unit, and the second engagement portion is a protrusion portion protruded inward from the corner of the opening.

5. The substrate structure according to claim 1, wherein the first engagement portions have different profiles.

6. The substrate structure according to claim 1, wherein the detachable first substrate unit further includes a plurality of first sawtooth portions disposed on center portions of sidewalls of the detachable first substrate unit, the substrate body further includes a plurality of second sawtooth portions disposed on center portions of the sidewalls of the second substrate units, and the first sawtooth portion is engaged with the second sawtooth portion to constitute the at least one sawtooth structure.

7. The substrate structure according to claim 1, wherein a dimension of the second substrate unit is substantially equal to a dimension of the opening.

8. The substrate structure according to claim 1, wherein a dimension of the detachable first substrate unit is substantially equal to a dimension of the opening.

9. The substrate structure according to claim 1, wherein a width of the detachable first substrate unit is substantially equal to or greater than a width of the opening.

10. The substrate structure according to claim 1, wherein the width of the detachable first substrate unit is greater than the width of the opening by 20 μm.

11. The substrate structure according to claim 1, wherein the opening is tapered from a top side to a bottom side thereof.

12. The substrate structure according to claim 11, wherein a maximum width of the detachable first substrate unit is greater than a minimum width of the opening.

13. The substrate structure according to claim 1, wherein the detachable first substrate unit further includes an effective area, and the first engagement portions are disposed outside the effective area.

14. The substrate structure according to claim 1, wherein a gap is between a sidewall of the detachable first substrate unit and the effective area of the detachable first substrate unit.

* * * * *